(12) United States Patent
Slessman

(10) Patent No.: US 10,114,353 B2
(45) Date of Patent: Oct. 30, 2018

(54) MODULAR DATA CENTER

(71) Applicant: BASELAYER TECHNOLOGY, LLC, Chandler, AZ (US)

(72) Inventor: George Slessman, Chandler, AZ (US)

(73) Assignee: BASELAYER TECHNOLOGY, LLC, Chandler, AZ (US)

( * ) Notice: Subject to any disclaimer, the term of this patent is extended or adjusted under 35 U.S.C. 154(b) by 0 days.

(21) Appl. No.: 15/714,960

(22) Filed: Sep. 25, 2017

(65) Prior Publication Data

US 2018/0107180 A1    Apr. 19, 2018

Related U.S. Application Data

(63) Continuation of application No. 14/228,103, filed on Mar. 27, 2014, now Pat. No. 9,772,610, which is a
(Continued)

(51) Int. Cl.
*H05K 7/20* (2006.01)
*G05B 15/02* (2006.01)
(Continued)

(52) U.S. Cl.
CPC .............. *G05B 15/02* (2013.01); *B31C 9/00* (2013.01); *B65D 15/08* (2013.01);
(Continued)

(58) Field of Classification Search
None
See application file for complete search history.

(56) References Cited

U.S. PATENT DOCUMENTS

| 4,860,163 A | 8/1989 | Sarath |
| 6,462,944 B1 | 10/2002 | Lin |

(Continued)

FOREIGN PATENT DOCUMENTS

WO    2007139560 A1    12/2007

OTHER PUBLICATIONS

European Patent Office, Communication pursuant to Article 94(3) EPC for Application No. 14 705 243.5-1808 dated Dec. 21, 2017.
(Continued)

*Primary Examiner* — Courtney Smith
(74) *Attorney, Agent, or Firm* — LKGlobal | Lorenz & Kopf, LLP

(57) ABSTRACT

A modular data center includes a controller; a data center control system configured to collect data center data associated with the modular data center via communication with one of the controller and a plurality of sensors; and a data module connected to a power supply source. The power supply source includes at least one of a power grid, a backup power source and a power module. The power module includes electronics equipment for conditioning and distributing power to the one or more data modules. The data module includes a first enclosure defining a first internal space; and a first sensor in the plurality of sensors. The first sensor is in communication with at least one of the controller and the data center control system. A second sensor in the plurality of sensors is in communication with the power supply source.

10 Claims, 18 Drawing Sheets

Related U.S. Application Data continuation of application No. 13/751,568, filed on Jan. 28, 2013, now Pat. No. 8,733,812, which is a continuation-in-part of application No. 12/626,278, filed on Nov. 25, 2009, now Pat. No. 8,434,804, application No. 15/714,960, which is a continuation of application No. 14/243,773, filed on Apr. 2, 2014, which is a continuation of application No. 13/751,568, filed on Jan. 28, 2013, now Pat. No. 8,733,812, which is a continuation-in-part of application No. 12/626,278, filed on Nov. 25, 2009, now Pat. No. 8,434,804.

(60) Provisional application No. 61/119,980, filed on Dec. 4, 2008.

(51) Int. Cl.
*B65D 65/46* (2006.01)
*B65D 41/04* (2006.01)
*B65D 8/00* (2006.01)
*B31C 9/00* (2006.01)
*H05K 7/14* (2006.01)
*F28F 9/02* (2006.01)
*B31B 50/00* (2017.01)

(52) U.S. Cl.
CPC ....... *B65D 41/0492* (2013.01); *B65D 65/466* (2013.01); *H05K 7/1497* (2013.01); *H05K 7/1498* (2013.01); *H05K 7/20709* (2013.01); *H05K 7/20745* (2013.01); *H05K 7/20836* (2013.01); *B31B 50/0014* (2017.08); *B65D 2565/385* (2013.01); *F28F 9/028* (2013.01); *F28F 9/0265* (2013.01); *G05B 2219/25004* (2013.01); *Y02W 90/13* (2015.05); *Y10T 428/1348* (2015.01)

(56) References Cited

U.S. PATENT DOCUMENTS

| | | | | |
|---|---|---|---|---|
| 6,574,104 B2 * | 6/2003 | Patel | .................. | H05K 7/20745 165/104.33 |
| 6,877,551 B2 | 4/2005 | Stoller | | |
| 6,877,581 B2 | 4/2005 | Badr et al. | | |
| 7,139,170 B2 * | 11/2006 | Chikusa | .................... | G06F 1/20 361/695 |
| 7,494,823 B2 | 2/2009 | Sukumar | | |
| 7,500,911 B2 | 3/2009 | Johnson et al. | | |
| 7,511,959 B2 | 3/2009 | Belady et al. | | |
| 7,511,960 B2 | 3/2009 | Hillis et al. | | |
| 7,551,971 B2 | 6/2009 | Hillis | | |
| 7,852,627 B2 | 12/2010 | Schmitt et al. | | |
| 7,854,652 B2 | 12/2010 | Yates et al. | | |
| 7,856,838 B2 | 12/2010 | Hillis et al. | | |
| 7,971,446 B2 * | 7/2011 | Clidaras | ................... | G06F 1/20 62/259.2 |
| 8,016,336 B2 | 9/2011 | Messinger et al. | | |
| 8,029,368 B2 | 10/2011 | Novis | | |
| 8,047,904 B2 | 11/2011 | Yates et al. | | |
| 8,077,457 B2 | 12/2011 | Gauthier et al. | | |
| 8,498,114 B2 | 7/2013 | Martini | | |
| 8,601,827 B2 | 12/2013 | Keisling et al. | | |
| 2004/0130868 A1 * | 7/2004 | Schwartz | .................. | G06F 1/20 361/679.48 |
| 2005/0225936 A1 | 10/2005 | Day | | |
| 2006/0082263 A1 | 4/2006 | Rimler et al. | | |
| 2007/0135032 A1 | 6/2007 | Wang | | |
| 2007/0228252 A1 * | 10/2007 | Tsai | ..................... | H01L 23/4006 248/671 |
| 2007/0260896 A1 * | 11/2007 | Brundridge | ........... | G06F 1/3203 713/300 |
| 2008/0055846 A1 * | 3/2008 | Clidaras | ................... | G06F 1/20 361/679.41 |
| 2008/0112128 A1 | 5/2008 | Holland | | |
| 2008/0123288 A1 * | 5/2008 | Hillis | ................... | H05K 7/1497 361/679.34 |
| 2009/0056910 A1 | 3/2009 | Mallia et al. | | |
| 2009/0086441 A1 * | 4/2009 | Randall | ................ | H05K 7/1492 361/724 |
| 2009/0120622 A1 | 5/2009 | Koch | | |
| 2009/0168345 A1 * | 7/2009 | Martini | ................ | F24F 11/0001 361/691 |
| 2009/0296321 A1 | 12/2009 | Wantschik | | |
| 2010/0051563 A1 | 3/2010 | Schreiber | | |
| 2010/0073871 A1 | 3/2010 | Flynn | | |
| 2010/0139887 A1 * | 6/2010 | Slessman | .............. | F28F 9/0265 165/67 |
| 2010/0165565 A1 * | 7/2010 | Hellriegal | ............... | G06F 1/183 361/679.46 |
| 2010/0226073 A1 | 9/2010 | Nicolai et al. | | |
| 2010/0238626 A1 | 9/2010 | Linhares, Jr. et al. | | |
| 2010/0252233 A1 | 10/2010 | Absalom | | |
| 2010/0321874 A1 | 12/2010 | Bhattacharyya et al. | | |
| 2011/0237174 A1 | 9/2011 | Felisi et al. | | |
| 2012/0033377 A1 | 2/2012 | Salpeter | | |
| 2013/0107448 A1 | 5/2013 | Hamburgen et al. | | |
| 2014/0124163 A1 | 5/2014 | Campbell et al. | | |

OTHER PUBLICATIONS

USPTO, Notice of Allowance and Fee(s) Due for U.S. Appl. No. 14/959,887 dated Mar. 26, 2018.

United States Patent and Trademark Office, Non-Final Office Action for U.S. Appl. No. 14/243,773, dated Jul. 6, 2018.

* cited by examiner

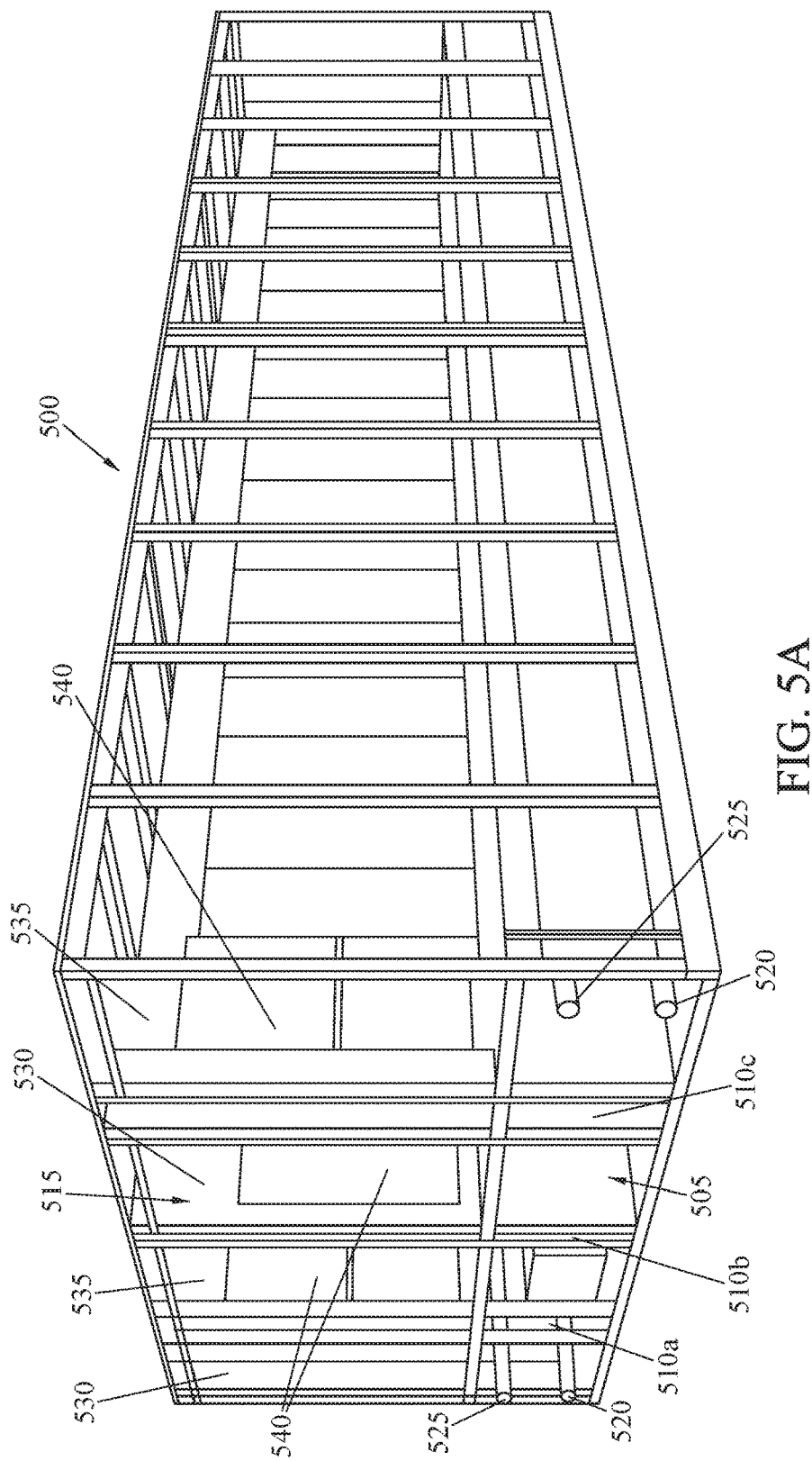

MODULAR DATA CENTER

CROSS-REFERENCES TO RELATED APPLICATIONS

This application is a continuation of, claims the benefit of and priority to U.S. patent application Ser. No. 14/228,103, filed Mar. 27, 2014. The '103 application is a continuation of, claims the benefit of and priority to U.S. patent application Ser. No. 13/751,568, filed Jan. 28, 2013. The '568 application is a continuation-in-part of, claims the benefit of and priority to U.S. patent application Ser. No. 12/626,278, filed Nov. 25, 2009 and titled "System and Method of Providing Computer Resources," which claims the benefit of and priority to U.S. Provisional Patent Application No. 61/119,980 filed Dec. 4, 2008, the contents of each are incorporated herein by reference in their entirety. This application is also continuation of, claims the benefit of and priority to U.S. patent application Ser. No. 14/243,773, filed Apr. 2, 2014. The '773 application is a continuation of, claims the benefit of and priority to U.S. patent application Ser. No. 13/751,568, filed Jan. 28, 2013. The '568 application is a continuation-in-part of, claims the benefit of and priority to U.S. patent application Ser. No. 12/626,278, filed Nov. 25, 2009 and titled "System and Method of Providing Computer Resources," which claims the benefit of and priority to U.S. Provisional Patent Application No. 61/119,980 filed Dec. 4, 2008, the contents of each are incorporated herein by reference in their entirety.

The entire contents of U.S. patent application Ser. No. 12/626,299, filed Nov. 25, 2009 and titled "Apparatus and Method of Environmental Condition Management for Electronic Equipment," and U.S. patent application Ser. No. 12/626,114, filed Nov. 25, 2009 and titled "Thermal Management Cabinet for Electronic Equipment," are incorporated herein by reference in their entirety.

FIELD OF THE TECHNOLOGY

The present technology relates to a modular data center, and in particular a modular data center system for providing the desired resources, environmental conditions and infrastructure for electronic or IT equipment

BACKGROUND

Data centers are facilities for housing electronic equipment, such as servers. A data center can occupy one room of a building, one or more floors, or an entire building. These facilities often have a large footprint due to the various components necessary for maintaining the facilities, including cooling equipment. Most of the equipment is often in the form of servers mounted in 19 inch rack cabinets, which are typically placed in single rows forming corridors between them. This allows people access to the front and rear of each cabinet. Servers differ greatly in size from IU servers to large freestanding storage silos which occupy many tiles on the floor. Some electronic equipment, such as mainframe computers and storage devices, are often as big as the racks themselves, and are placed alongside them. Local building codes can affect the footprint of the facility and thus the overall cost of maintaining the electronic equipment.

Cooling of server racks and cabinets in the facilities can be problematic, particularly as processors typically produce large amounts of heat. It has been found that for every 1 watt of power used for Information Technology, 0.5 to 2 watts of power are used for cooling the electronic components, and thus the need for cooling uses a very high percentage of the total IT power consumption The power dissipation of high-performance CPU processors is predicted to exceed 150 W in the near future. The high-density packing of servers and the desire for lower CPU junction temperatures to achieve higher reliability of components means that thermal management of server racks is an increasing concern. Various solutions have been proposed, many of which involve large numbers of fans to keep a constant airflow over the electronic components. However, such solutions suffer from drawbacks associated with the power supply needed to power the fans, as well as reliability of such fans. Moreover, these are generally located in large facilities which further exacerbates the drawbacks In a number of solutions, server cabinets are placed on a false floor with cool air from an HVAC system being supplied through the false floor to a vent in front of the cabinet. The cooling airflow is then drawn front-to-back through the cabinet using fans, and vented out to the back of the cabinet. With such arrangements, it is desirable to use a "hot-aisle/cold-aisle" arrangement so that server fronts are arranged facing one another so that two aisles can draw cool air from a single vent area, and so that the server backs also face one another. The hot air is then allowed to vent to air return units in the ceiling. This can lead to "hot spots" in the server room, however, much of the hot air can also mix with the cool air circulating in the room. Various solutions to such problems involve the use of baffles extending from the top of the server cabinet to the ceiling to try to prevent some of the mixing between the hot and cold air.

The maximum allowed temperature range for a server in a data center is typically 59 to 90 degrees Fahrenheit, while the recommended temperature is typically between 68 and 77 degrees Fahrenheit. As the known data center storage solutions typically allow some mixing of air prior to the air reaching the electronic components, data centers typically pump cold air at between 55 and 60 degrees Fahrenheit to account for the temperature increase in the air before it can act to cool the components.

SUMMARY OF THE TECHNOLOGY

Accordingly there is a need for an efficient data center capable of providing the power and environmental management required to support IT equipment. Moreover, there is a need for a highly-scalable and rapidly deployable data center.

In one aspect, there is a data center that can include one or more data modules. The data center can include a network module connected to the one or more data modules, the network module containing equipment for facilitating data communications by the one or more data modules. The data center can include a power module connected to the one or more data modules and the network module, the power module containing electronics equipment for conditioning and distributing power to the one or more data modules and the network module. Each module of the one or more data modules, the network module, and the power module can include an enclosure defining an internal space; a floor within the enclosure separating the internal space into an above-floor space and a sub-floor space; and a plurality of bays in the subfloor space, each bay of the plurality of bays configured to contain a field-replaceable environmental management component.

In some embodiments, the enclosures of the one or more data modules, the network module, and the power module have substantially the same dimensions.

In some embodiments, the data center can include a heat exchanger in a first bay of the plurality of bays in a data module of the one or more data modules, the heat exchanger configured to remove heat from air within the enclosure of the data module.

In some embodiments, the data center can include a structure disposed in the above-floor space separating the above-floor space into a first aisle and a second aisle, and wherein the heat exchanger is further configured to remove heat from air flowing from the first aisle. In some embodiments, the structure disposed in the above-floor space comprises one or more cabinets of computing equipment.

In some embodiments, a module of the one or more data modules, the network module, and the power module includes a controller disposed in the data module and one or more sensors disposed in the data module in communication with the controller, wherein the controller adjusts an environmental parameter of the data module based on one or more signals from the one or more sensors.

In some embodiments, the environmental parameter is one of a temperature within the enclosure, a pressure within the enclosure, a humidity within the enclosure, or an airflow speed within the enclosure. In some embodiments, the one or more sensors are one of a temperature sensor, pressure sensor, humidity sensor, fan speed sensor, or valve position sensor.

In some embodiments, the data center can include a data center control system, wherein each module of the one or more data modules, the network module, and the power module further comprises: one or more sensors disposed in the module, and wherein the data center control system is configured to receive signals from the one or more sensors in each module of the one or more data modules, the network module, and the power module.

In some embodiments, the data center can include a humidifier in a first bay of the plurality of bays in a data module of the one or more data modules. In some embodiments, the data center can include a network operations center in a data module of the one or more data modules.

In another aspect there is a method of deploying a data center. The method can include supplying one or more data modules. The method can include connecting a network module to the one or more data modules, the network module containing equipment for facilitating data communications by the one or more data modules. The method can include connecting a power module to the one or more data modules and the network module, the power module containing electronics equipment for conditioning and distributing power to the one or more data modules and the network module. In the method, each module of the one or more data modules, the network module, and the power module can include: an enclosure defining an internal space; a floor within the enclosure separating the internal space into an above-floor space and a sub-floor space; and a plurality of bays in the subfloor space, each bay of the plurality of bays configured to contain a field-replaceable environmental management component.

The method can include disposing a heat exchanger in a first bay of the plurality of bays in a data module of the one or more data modules, the heat exchanger configured to remove heat from air within the enclosure of the data module.

The method can include disposing a structure in the above-floor space separating the above-floor space into a first aisle and a second aisle, and wherein the heat exchanger is further configured to remove heat from air flowing from the first aisle.

In some embodiments, a module of the one or more data modules, the network module, and the power module can include: a controller disposed in the data module; and one or more sensors disposed in the data module in communication with the controller, wherein the controller adjusts an environmental parameter of the data module based on one or more signals from the one or more sensors.

In some embodiments, the environmental parameter is one of a temperature within the enclosure, a pressure within the enclosure, a humidity within the enclosure, or an airflow speed within the enclosure. In some embodiments, the one or more sensors are one of a temperature sensor, pressure sensor, humidity sensor, fan speed sensor, or valve position sensor.

The method can include providing a data center control system, wherein each module of the one or more data modules, the network module, and the power module further comprises: one or more sensors disposed in the module, wherein the data center control system is configured to receive signals from the one or more sensors in each module of the one or more data modules, the network module, and the power module.

The method can include disposing a humidifier in a first bay of the plurality of bays in a data module of the one or more data modules. The method can include disposing a network operations center in a data module of the one or more data modules.

In another aspect, there is a method of provisioning a data center. The method can include providing one or more data modules based on a computing capacity parameter. The method can include connecting one or more network modules to the one or more data modules based on the computing capacity parameter and a redundancy parameter, the one or more network modules containing equipment for facilitating data communications by the data modules. The method can include connecting one or more power modules to the one or more data modules and the one or more network modules based on the computing capacity parameter and the redundancy parameter, the one or more power modules containing electronics equipment for conditioning and distributing power to the one or more data modules and the one or more network modules, wherein each module of the one or more data modules, the one or more network modules, and the one or more power modules comprises: an enclosure defining an internal space; a floor within the enclosure separating the internal space into an above-floor space and a subfloor space; and a plurality of bays in the subfloor space, each bay of the plurality of bays configured to contain a field-replaceable environmental management component.

In some embodiments, the computing capacity parameter is one of a power capacity, a processing capacity, or a storage capacity. In some embodiments, the enclosures of the one or more data modules, the one or more network modules, and the one or more power modules have substantially the same dimensions. The method can include disposing one or more heat exchangers in the plurality of bays in the one or more data modules based on the computing capacity parameter and a redundancy parameter.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the present invention, as well as the invention itself, will be more fully understood from the following description of various embodiments, when read together with the accompanying drawings, in which:

FIG. 5A depicts a perspective view of a data module.

DETAILED DESCRIPTION

The exemplary embodiments of the present technology are described with respect to providing resources, environmental conditions and infrastructure for electronic equipment. It should be understood by one of ordinary skill in the art that the embodiments of the present technology are merely exemplary and can be applied in other configurations.

Figure 1A:
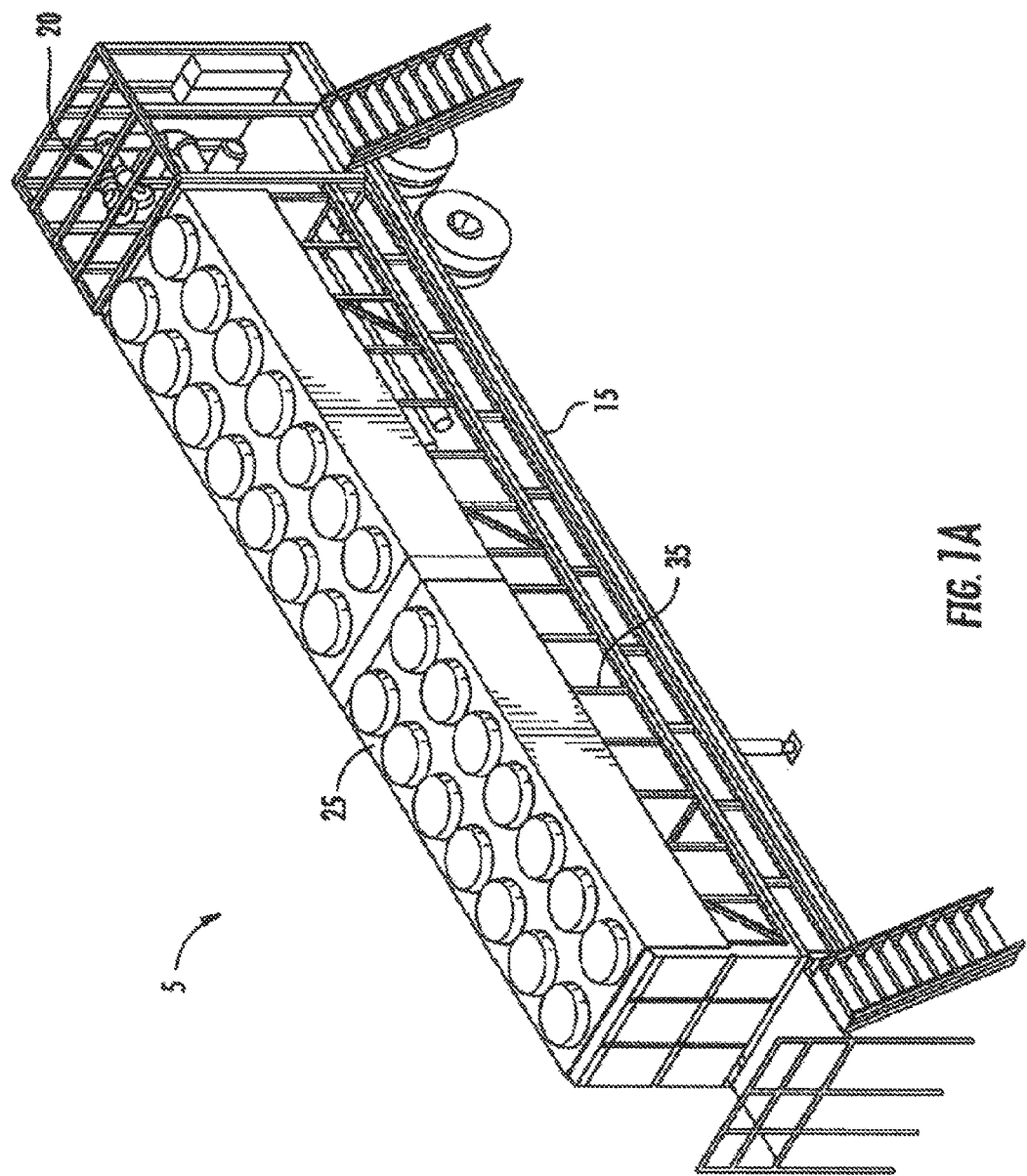
FIG. 1A is a perspective schematic view of a data center module according to an embodiment of the technology.
Figure 1B:
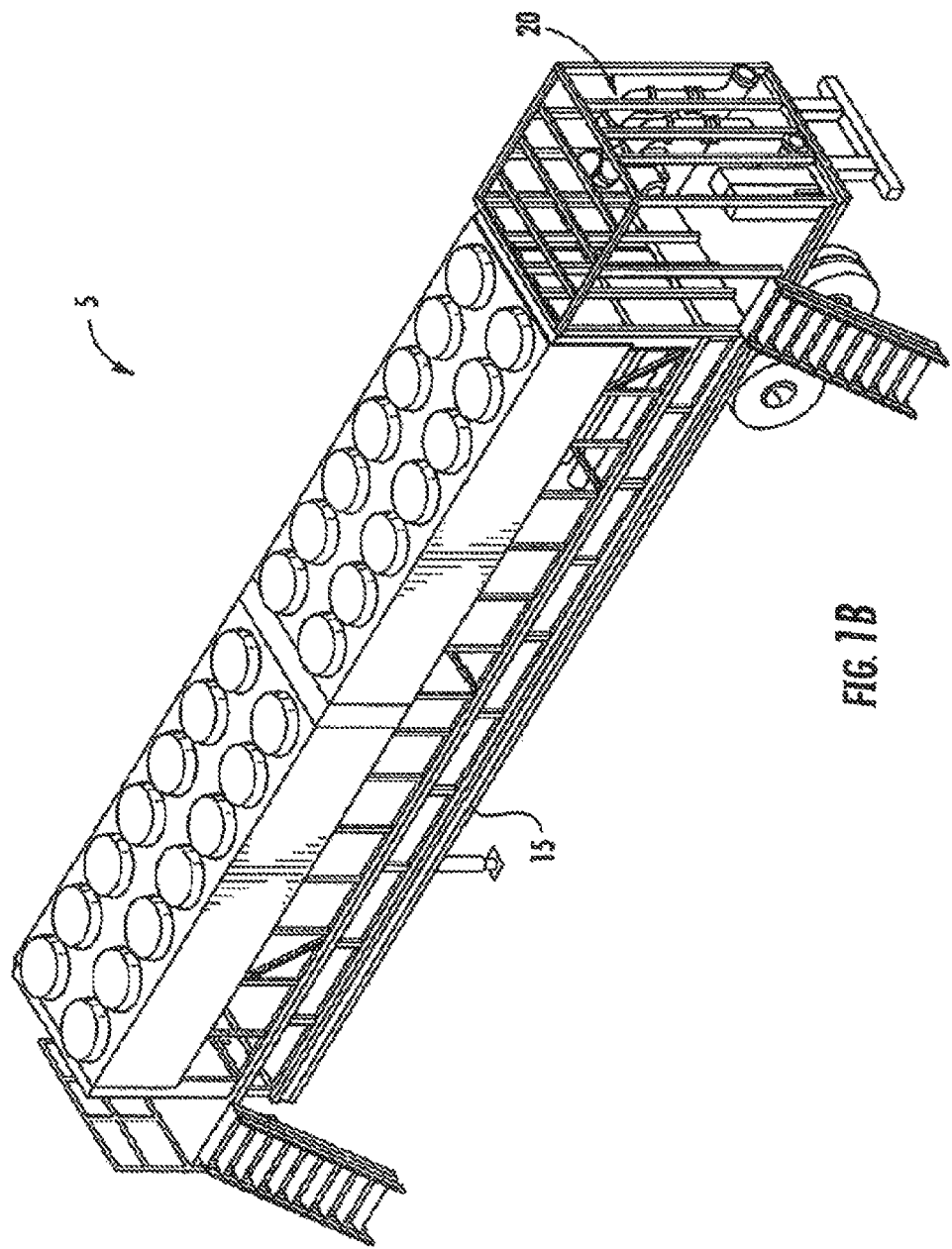
FIG. 1B is a second perspective schematic view of the data center module of FIG. 1A.

Referring to the drawings and in particular FIGS. 1A and 1B, an exemplary mobile data center system 5 is illustrated. The system 5 can include a support structure 15 which is capable of being moved to various locations, including remote locations, and then connected to a network at the new location, such as through a hardwire link, for providing computer resources. In one embodiment, the support structure 15 can be a trailer with wheels that is capable of being towed. In another embodiment, the support structure 15 can be a self-contained moving vehicle; i.e., a drivable vehicle.

The system 5 can include a power sub-system having generator 20 that provides power to electronic equipment, such as servers, as well as other sub-systems, including a cooling system and a control system. In one embodiment, the generator 20 can be a self-contained power generating device, such as a diesel generator. However, the present disclosure contemplates the use of other power supply devices, which may or may not be connectable with outside power supply sources, such as the power grid at the remote location. For example, the power sub-system can be connectable with the power grid for receiving additional power as needed. Other power supply sources that can be used to supplement or otherwise provide energy to system 5, can include solar power sources, wind power sources, hydrogen power sources and so forth.

Figure 1C:
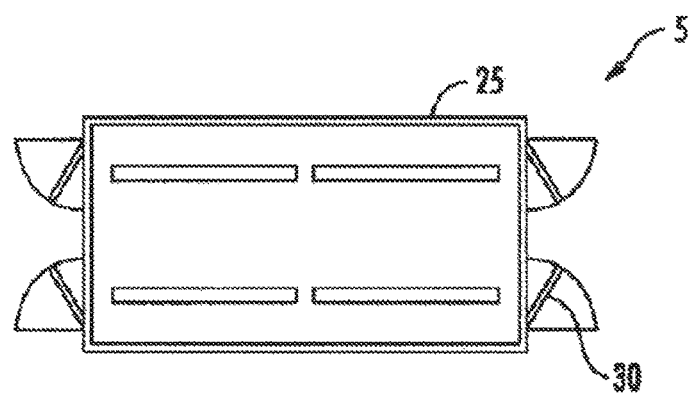
FIG. 1C is a top schematic illustration of a data center module housing.
Figure 1D:
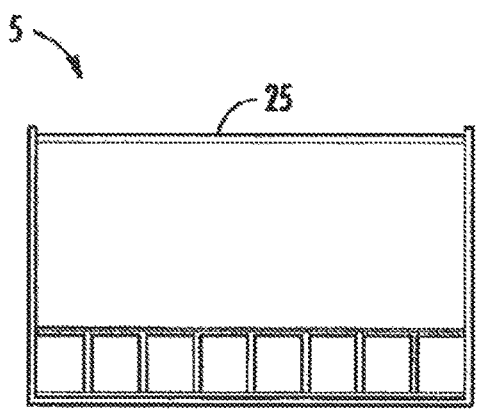
FIG. 1D is a side schematic illustration of a data center module housing.
Figure 1E:
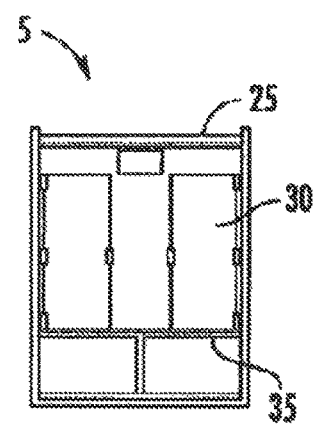
FIG. 1E is a front schematic illustration of a data center module housing.
Figure 1G:
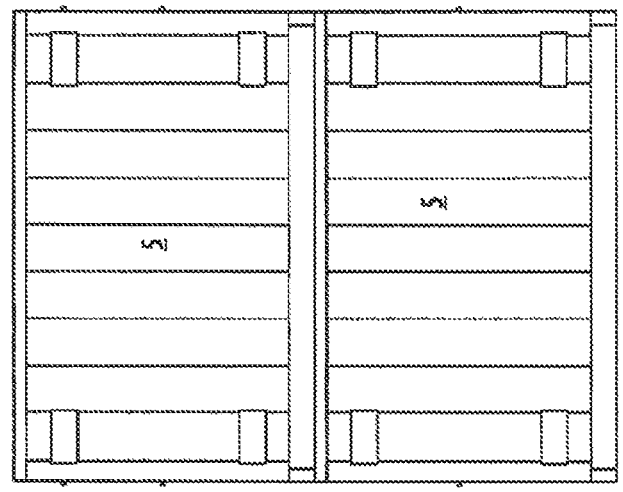
FIGS. 1F, 1G, 1H, and 1I are schematic illustrations of data center module housing.
Figure 1H:
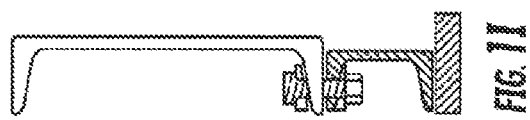
Figure 1I:
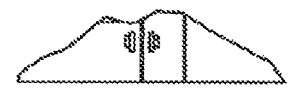
Figure 1F:
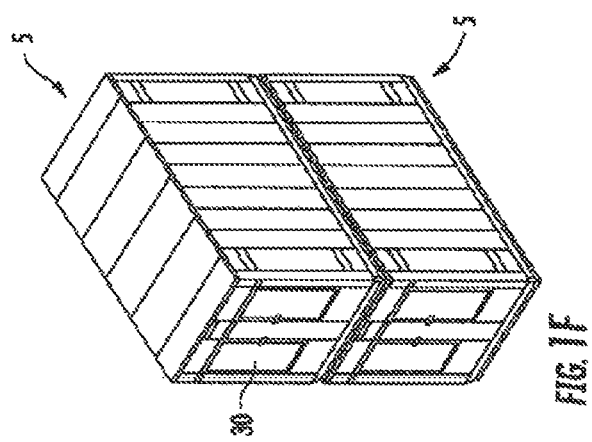

Referring to FIGS. 1C, 1D, and 1E, in one embodiment, a modular data center can comprise one or more housings 25 for the electronic equipment, which may have various points of access including rear and top ports or doors. In one embodiment, doors 30 can provide access to the inner volume of the housings 25 which can have a raised floor 35, such as a platform with bar gratings. The raised floor 35 can provide access for electrical wiring, cooling conduit and the like to individual cabinets that house the servers. The housings 25 can be configured in various ways including coaxially, such as in FIG. 1A or stacked on each other as in FIGS. 1F, 1G, 1H, and 1I.

Figure 1J:
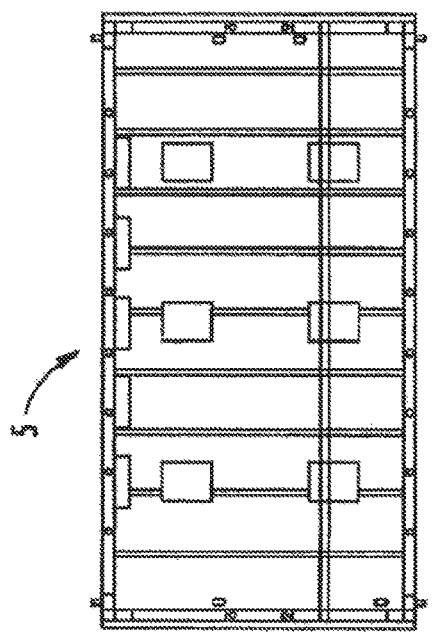
FIGS. 1J, 1K, and 1L are schematic illustrations of a data center module housing.
Figure 1L:
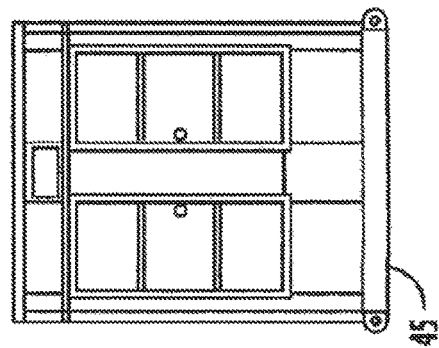
Figure 1K:
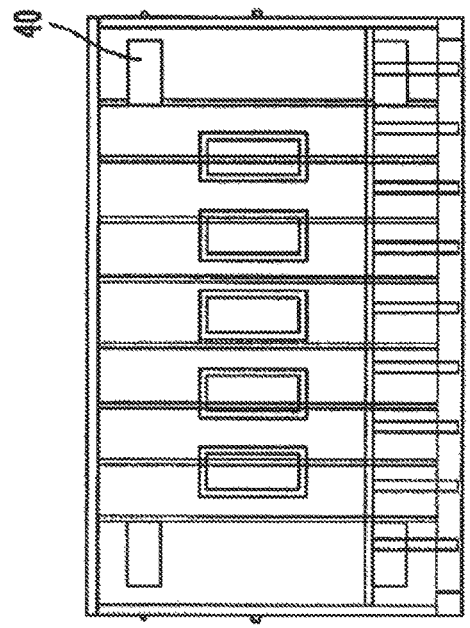

In another embodiment, the housing 25 can be formed using thermally insulated walls, including a non-perforated liner. Referring additionally to FIGS. 1J, 1K, and 1L, the housing 25 can include a number of access panels 40. A lifting structure 45, such as a lift lug, can be provided to facilitate positioning of the housing 25 with respect to a support structure (e.g., support structure 15).

Data center modules can house electronic equipment (e.g., servers, computer equipment, networking equipment, and/or power storage, generation, or distribution equipment). The electronic equipment can be positioned in a plurality of cabinets such as arranged in rows with access to the rows being provided by the doors 30, although the present disclosure also contemplates other configurations for the cabinets. The particular configuration of the rows can be selected based on a number of factors, including facilitating adjustment of environmental conditions associated with the cabinets and/or maximizing, facility space.

In one embodiment, different housings 25 can have different required environmental conditions. For example, a first housing 25 can include cabinets that are housing servers, which require a large amount of cooling while a second housing includes cabinets housing routers that require a smaller amount of cooling. By grouping the cabinets according to environmental requirements (e.g., desired temperature and humidity ranges), system 5 can more efficiently control the environments associated with the particular electronic equipment.

As described above, system 5 can include a cooling sub-system for delivery of a cooling fluid to each of the cabinets. The particular configuration of the cooling system, including the positioning of the various components, such as a chiller, conduits, fans and so forth, can vary. In one embodiment, the cooling, fluid can comprise air, such as delivered through the use of pressurized plenums. The particular conduit configuration for delivery of the air to the cabinets can vary. For example, an air supply channel can supply cooling air to multiple cabinets and/or multiple rows of cabinets. In one embodiment, each cabinet can be connected directly to an air supply channel so that each cabinet receives air that flows directly from the cooling subsystem rather than from another cabinet. In another embodiment, the cabinets can be arranged or grouped so that a portion of the cabinets receive cooling in series. For example, a first group of cabinets requiring a large amount of cooling can directly receive air that has been cooled by the cooling subsystem. This cold air can flow across the electronic equipment of the first group of cabinets and then can be directed towards a second Group of cabinets that require a smaller amount of cooling. The air can then be returned to the cooling subsystem for removal of the heat that has been transferred to the air by the first and second groups of cabinets.

Figure 2A:
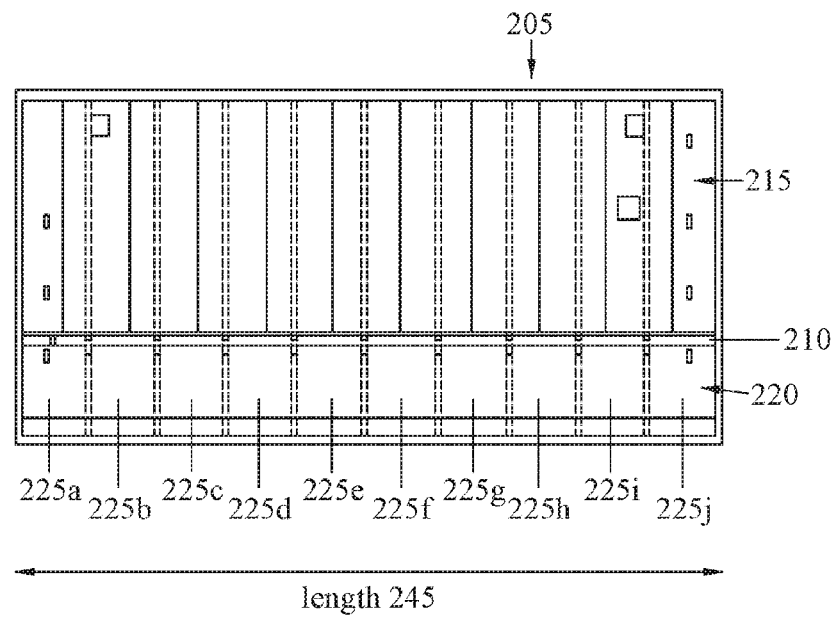
FIGS. 2A, 2B, and 2C depict an enclosure for use in a modular data center.
Figures 2B, 2C:
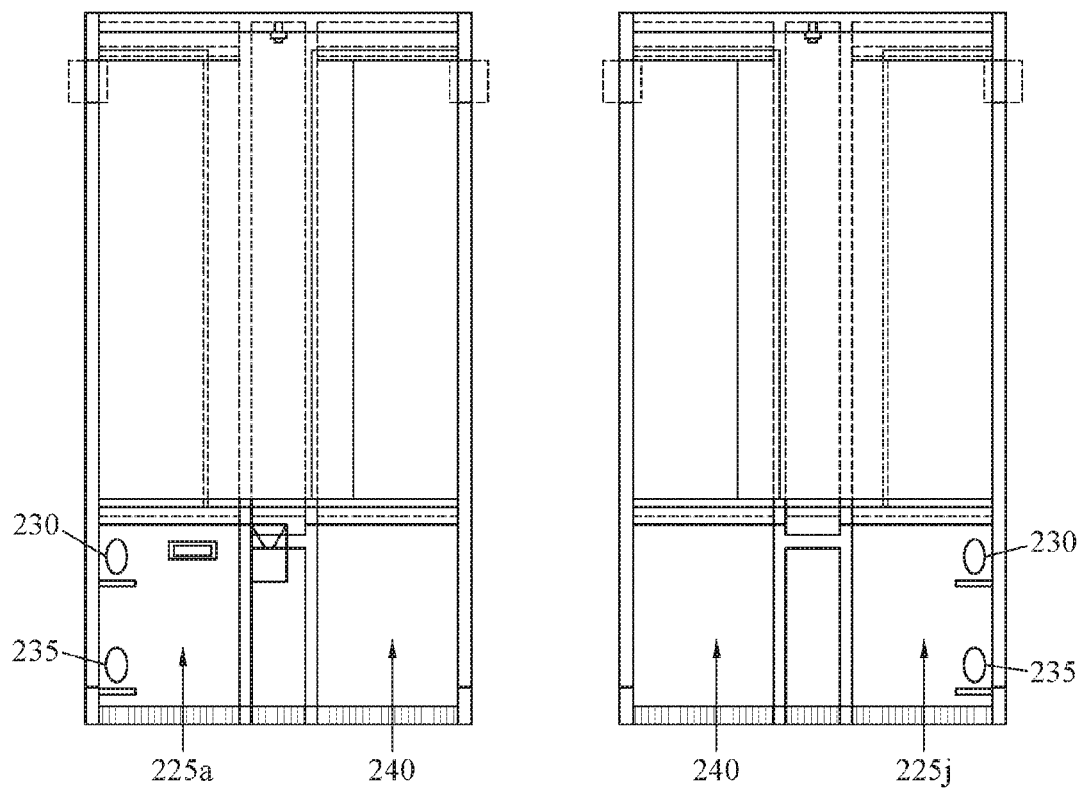

FIGS. 2A, 2B, and 2C depict an enclosure 205 for use in a modular data center. In the illustrated embodiment, floor 210 is disposed in the interior of enclosure 205, creating above-floor space 215 and sub-floor space 220. Above-floor space 215 can accommodate, for example, IT equipment (e.g., servers, storage systems, networking equipment, etc.), power generation, storage, and distribution equipment, and/or any other equipment. Sub-floor space 220 contains bays 225a-225j. Bays 225a-225j can contain environmental management components (not shown) for monitoring and/or controlling the environmental conditions (e.g., temperature, humidity, air pressure, etc.) of above floor space 215 and/or other equipment for monitoring, controlling, and maintaining the operation of a data center. Chilled fluid supply pipe 230 and fluid return pipe 235 can be disposed in sub-floor space 220.

In some embodiments, one or more of bays 225a-225j contain air handler units (AHUs). An AHU can connect to chilled fluid supply pipe 230 and fluid return pipe 235. Chilled fluid supply pipe 230 can provide chilled fluid to and fluid return pipe 235 can carry fluid away from an AHU for use in removing heat energy from the above-floor space, as will explained in greater detail below. In some embodiments, one or more of bays 225a and or 225j can contain makeup air handler units (MAUs). MAUs can be used to regulate the environment in the above-floor space by drawing air from outside the enclosure into the interior and expelling air from inside the enclosure (e.g., for maintaining humidity and/or supplying fresh air). In some embodiments, refrigerant can be supplied to the enclosure 205 for cooling the above-floor space 215. One or more of bays 225a-225j can contain refrigerant-based cooling equipment (not shown) to maintain the environmental conditions (e.g., temperature, humidity, air pressure, etc.) of above-floor space 215.

In some embodiments, the environmental management components are field replaceable and/or hot-swappable. Access space 240 runs along length 245 of sub-floor space 220 of enclosure 205 and adjacent to bays 225a-225b. During maintenance, an environmental component can be moved from a bay (e.g., bays 225a-225j) into the adjacent and connecting access space 240 and then removed through the end of enclosure 205. A new environmental component can similarly be placed in a bay (e.g., bays 225a-225j) through access space 240. In some embodiments, the number of environmental management components (e.g., AHUs) in the enclosure is variable depending on the cooling needs of the IT equipment in the enclosure. The number of environmental management components can also be adjusted during operation to scale cooling capability of the enclosure up or down.

FIGS. 2A-2C depict the exterior of enclosure 205. Enclosure 205 can include exterior walls enclosing the interior of enclosure 205. Wall can be made of a variety of materials, including, for example, metals, plastics, or other materials depending on the intended environment and use of enclosure 205. Enclosure 205 can include access doors for accessing its interior.

Modular Data Center

Figure 3:
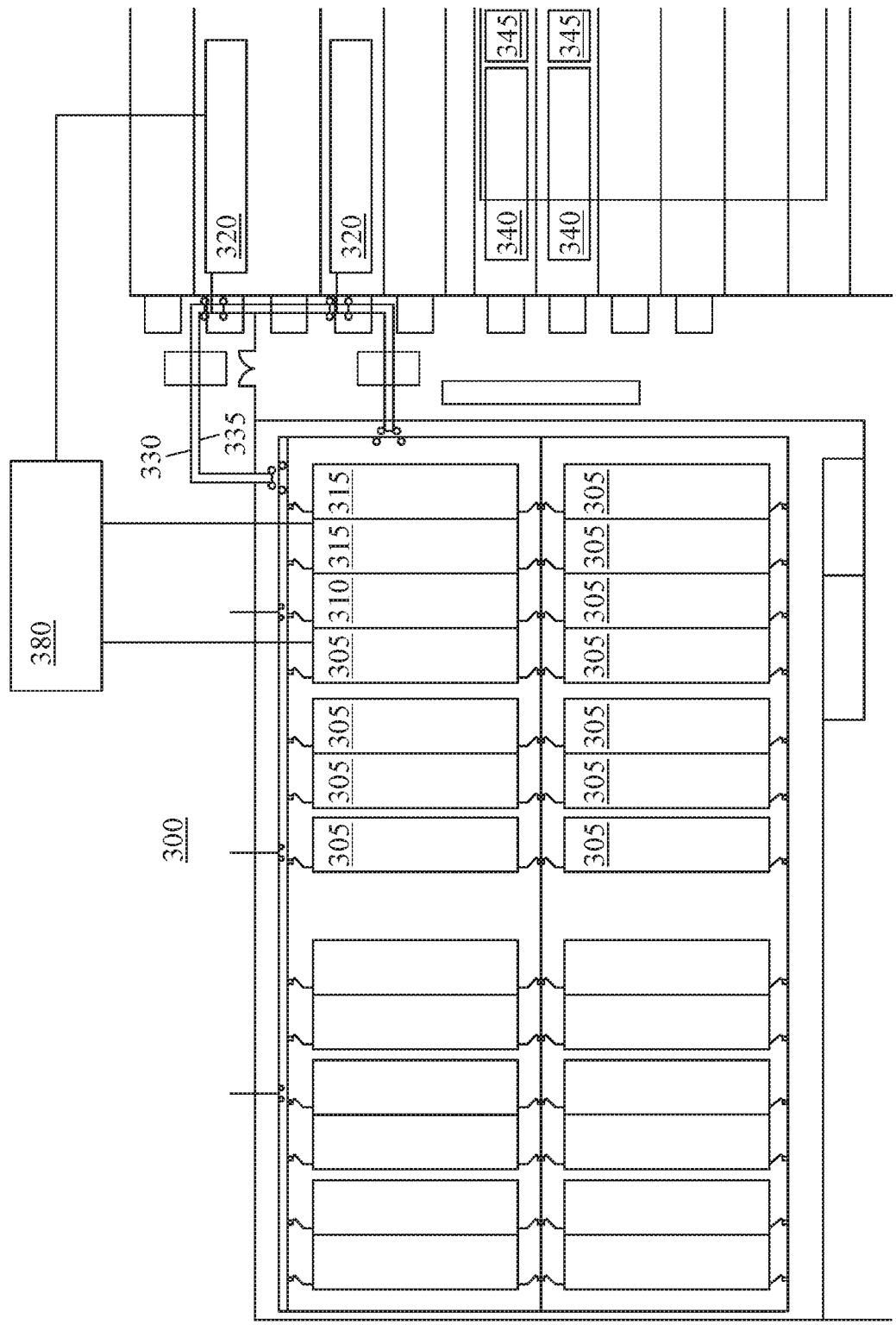
FIG. 3 depicts a modular data center.

FIG. 3 depicts a modular data center 300. In the illustrated embodiment, modular data center 300 includes data modules 305, network module 310, and power modules 315. Modular data center 300 includes chiller modules 320. Chiller modules 320 can provide chilled fluid to data modules 305, network module 310, and power modules 315 via chilled fluid supply pipe 330 and fluid return pipe 335. Modular data center 300 includes generator modules 340 and fuel tanks 345. Fuel tanks 345 can provide fuel to generator modules 340 to produce electricity for data center 300. In some embodiments, generator modules 340 can generate electricity for modular data center during normal operation. In some embodiments, generator modules 340 provide backup electricity for modular data center 300 when a primary electricity source (e.g., a utility grid) is no longer available.

Figure 4:
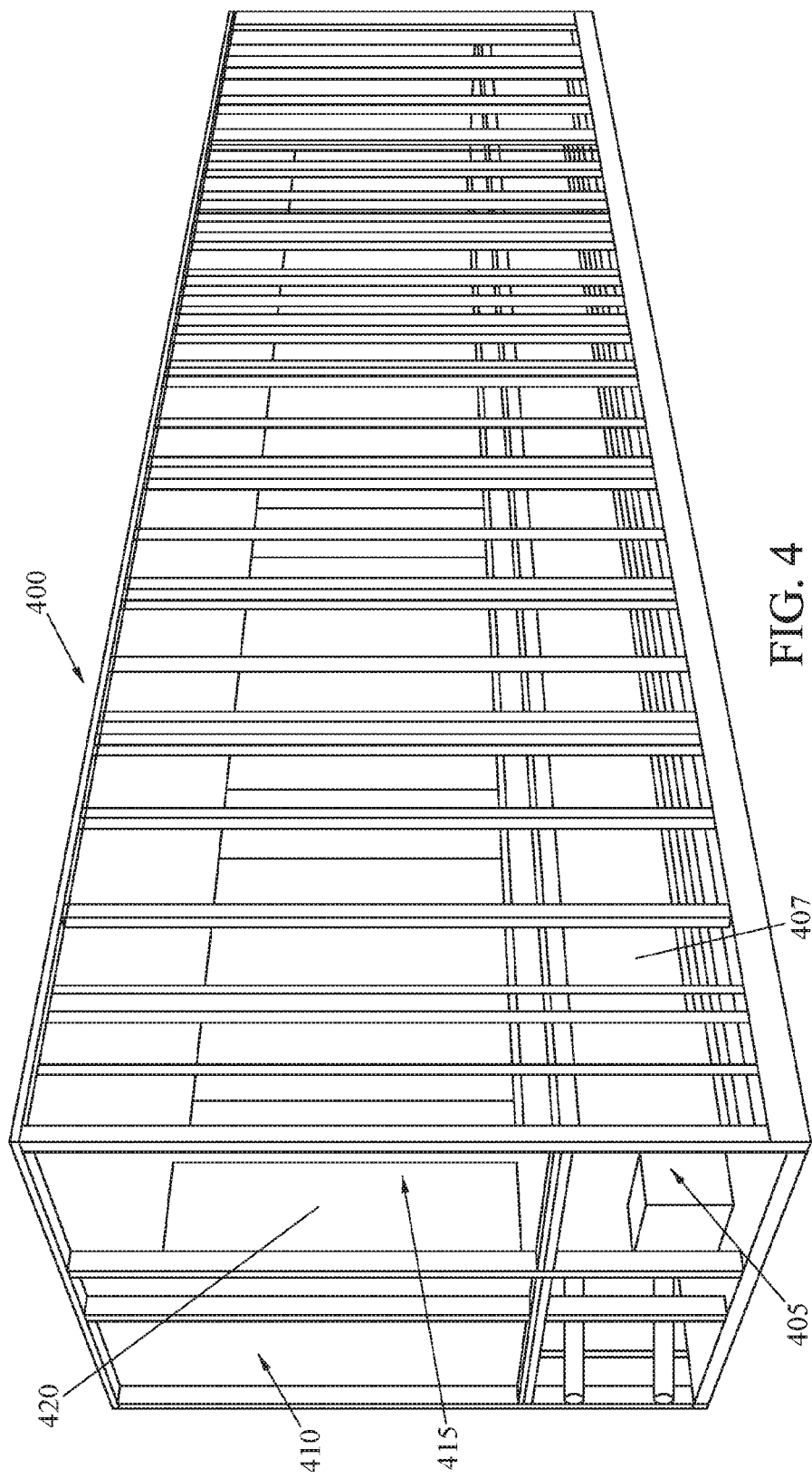
FIG. 4 depicts a perspective view of a data module.

As discussed above, modular data center 300 can include data modules 305, network module 310, and power modules 315. FIG. 4 depicts a perspective view of data module 400. Data module 400 can be based on, for example, enclosure 205 of FIGS. 2A-2C. As illustrated, data module 400 includes sub-floor space 405 that can be used to house various equipment as described above. For example, sub-floor space 405 can contain environmental management components for monitoring and/or controlling the environmental conditions (e.g., temperature, humidity, air pressure, etc.) and/or other equipment for monitoring, controlling, and maintaining the operation of a data center. In the illustrated embodiment, air handler 407 is shown in sub-floor space 405.

Data module 400 includes an above-floor space that includes hot aisle 410 and cold aisle 415. In the illustrated embodiment, hot aisle 410 and cold aisle 415 are at least partially separated by IT equipment 420. IT equipment 420 can include servers, storage systems, and/or networking equipment. In some embodiments (not shown), hot aisle 410 and cold aisle 415 are at least partially separated by a barrier, such as the barriers described in U.S. patent application Ser. No. 12/837,167, titled Apparatus and Method for Regulating Various Conditions Affecting Electronic Equipment, and filed Jul. 15, 2010, the contents of which are hereby incorporated by reference. Such barriers, for example, can be used to provide greater separation of hot aisle 410 and cold aisle 415. In some embodiments, an air pressure differential between hot aisle 410 and cold aisle 415 is maintained by environmental management components in sub-floor space 405. As described in greater detail below, the air pressure differential can facilitate cooling IT equipment and reduce hot/cold aisle recirculation.

While data module 400 is illustrated with IT equipment 420 dividing the above-floor space into hot aisle 410 and cold aisle 415, it should be appreciated that data module 400 can accommodate any arrangement of IT equipment in the above-floor space.

FIG. 5A depicts a perspective view of data module 500. As illustrated, data module 500 includes sub-floor space 505 that can house various equipment as described above. For example, sub-floor space 505 can contain environmental management components for monitoring and/or controlling the environmental conditions (e.g., temperature, humidity, air pressure, etc.) and/or other equipment for monitoring, controlling, and maintaining the operation of a data center. In the illustrated embodiment, data module 500 includes two rows of environmental management equipment, row 510a and row 510b. Rows 510a and 510b can facilitate creating multiple hot, cold, or mixed-air aisles in above-floor space 515, as will be described in greater detail below. Data module 500 can include chilled fluid supply pipes 520 and fluid return pipes 525 disposed in sub-floor space 505 for supplying chilled fluid to the environmental management equipment.

In the illustrated embodiment, above-floor space 515 is separated into hot aisles 530 and mixed-air aisles 535. Hot aisles 530 and mixed-air aisles 535 are at least partially separated by IT equipment 540.

Figure 5B:
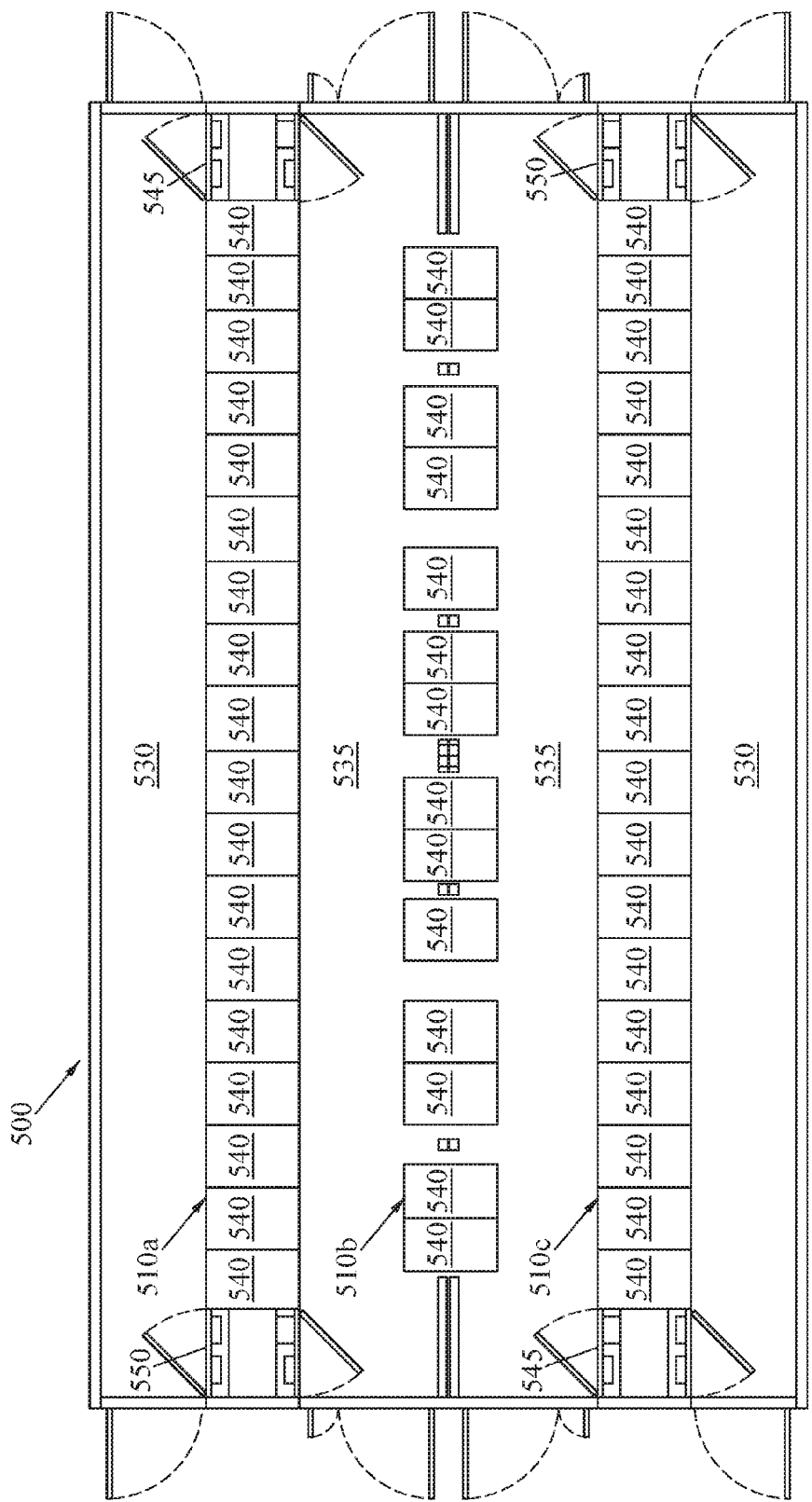
FIG. 5B depicts a top view of a data module showing hot and cold aisles.

FIG. 5B depicts a top view of data module 500 showing hot and mixed-air aisles 530 and 535. Data module 500 contains three rows of IT equipment 540, row 542a, row 542b, and row 542c. Rows 542a, 542b, and 542c can be positioned to create multiple hot and mixed-air aisles in above-floor space 515 (e.g., hot aisles 530 and mixed-air aisles 535). In the illustrated embodiment, the pieces of IT equipment in rows 542a and 542c are positioned such that warm air from the IT equipment is exhausted into hot aisles 530. The pieces of IT equipment in row 542b can be positioned such that the pieces of IT equipment alternate so that adjacent pieces of IT equipment exhaust warm air in opposite directions, forming mixed-air aisles 535. IT equipment 540 can include servers, storage systems, and/or networking equipment. In some embodiments (not shown), hot aisles 530 and mixed-air aisles 535 are at least partially separated by a barrier. Such barriers, for example, can be used to provide greater separation of hot aisles 530 and mixed-air aisles 535. In some embodiments, an air pressure differential between hot aisles 530 and mixed-air aisles 535 is maintained by environmental management components. As described in greater detail below, the air pressure differential can facilitate cooling IT equipment and reduce recirculation.

Data module 500 includes power distribution units (PDUs) 545, which distribute electrical power to IT equipment 540 and any environmental management equipment. Data module 500 includes remote power panels (RPPs) 550, which distribute power from, for example, a power module to PDUs 545.

Figure 6:
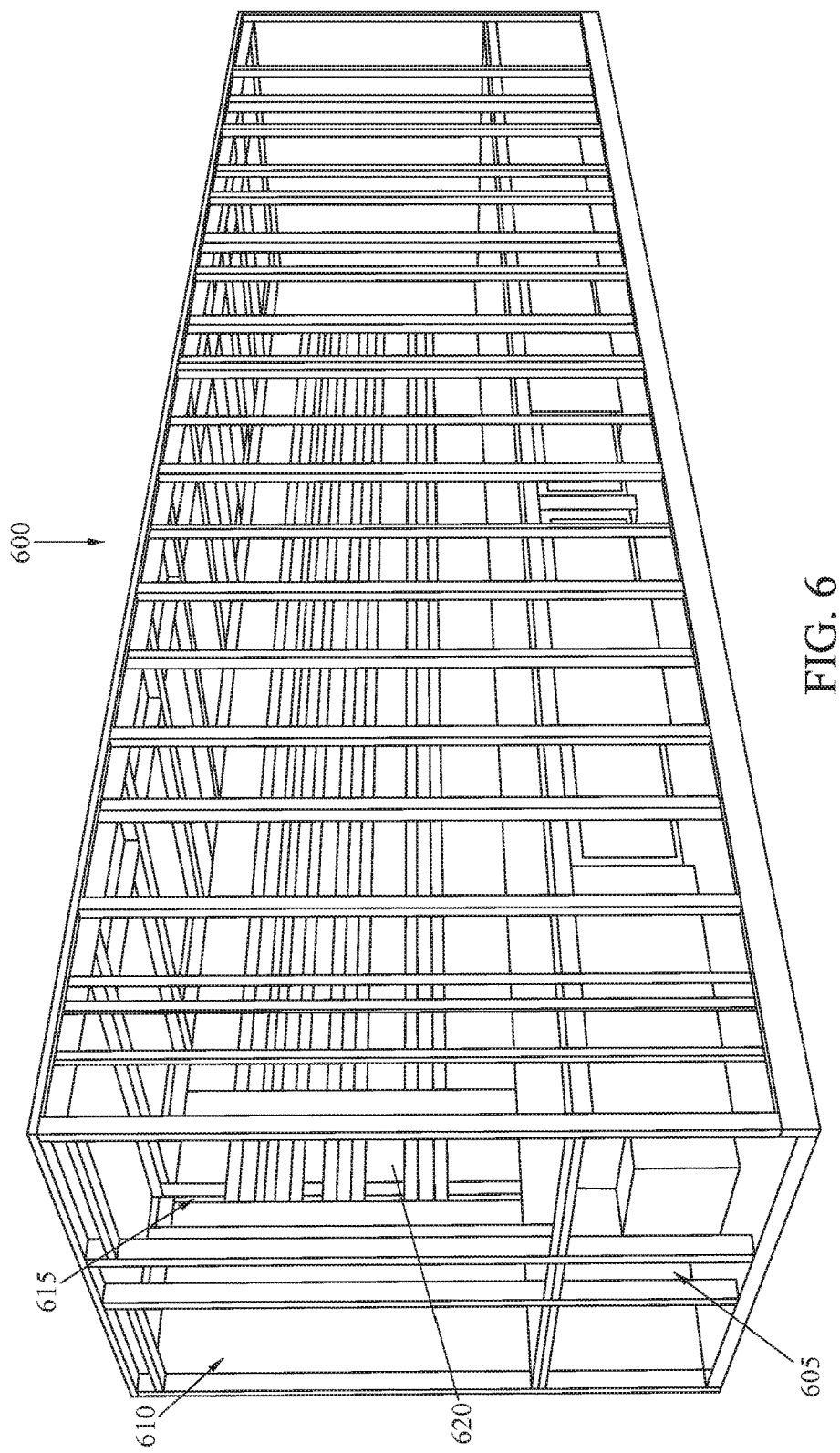
FIG. 6 depicts a perspective view of a network module.

FIG. 6 depicts a perspective view of network module 600. Network module 600 can be based on, for example, enclosure 205 of FIGS. 2A-2C. As illustrated, network module 600 includes sub-floor space 605 that can house various equipment as described above. For example, sub-floor space 605 can contain environmental management components for monitoring and/or controlling the environmental conditions (e.g., temperature, humidity, air pressure, etc.) and/or other equipment for monitoring, controlling, and maintaining the operation of a data center.

Network module 600 includes an above-floor space that includes hot aisle 610 and cold aisle 615. In the illustrated embodiment, hot aisle 610 and cold aisle 615 are at least partially separated by networking equipment 620. Networking equipment 620 can include networking equipment, such as network switches and/or routers. In some embodiments (not shown), hot aisle 610 and cold aisle 615 are at least partially separated by a barrier, as described above with reference to FIG. 4. In some embodiments, an air pressure differential between hot aisle 610 and cold aisle 615 is maintained by environmental management components in sub-floor space 605. As described in greater detail below, the air pressure differential can facilitate cooling IT equipment and reduce hot/cold aisle recirculation.

Figure 7:
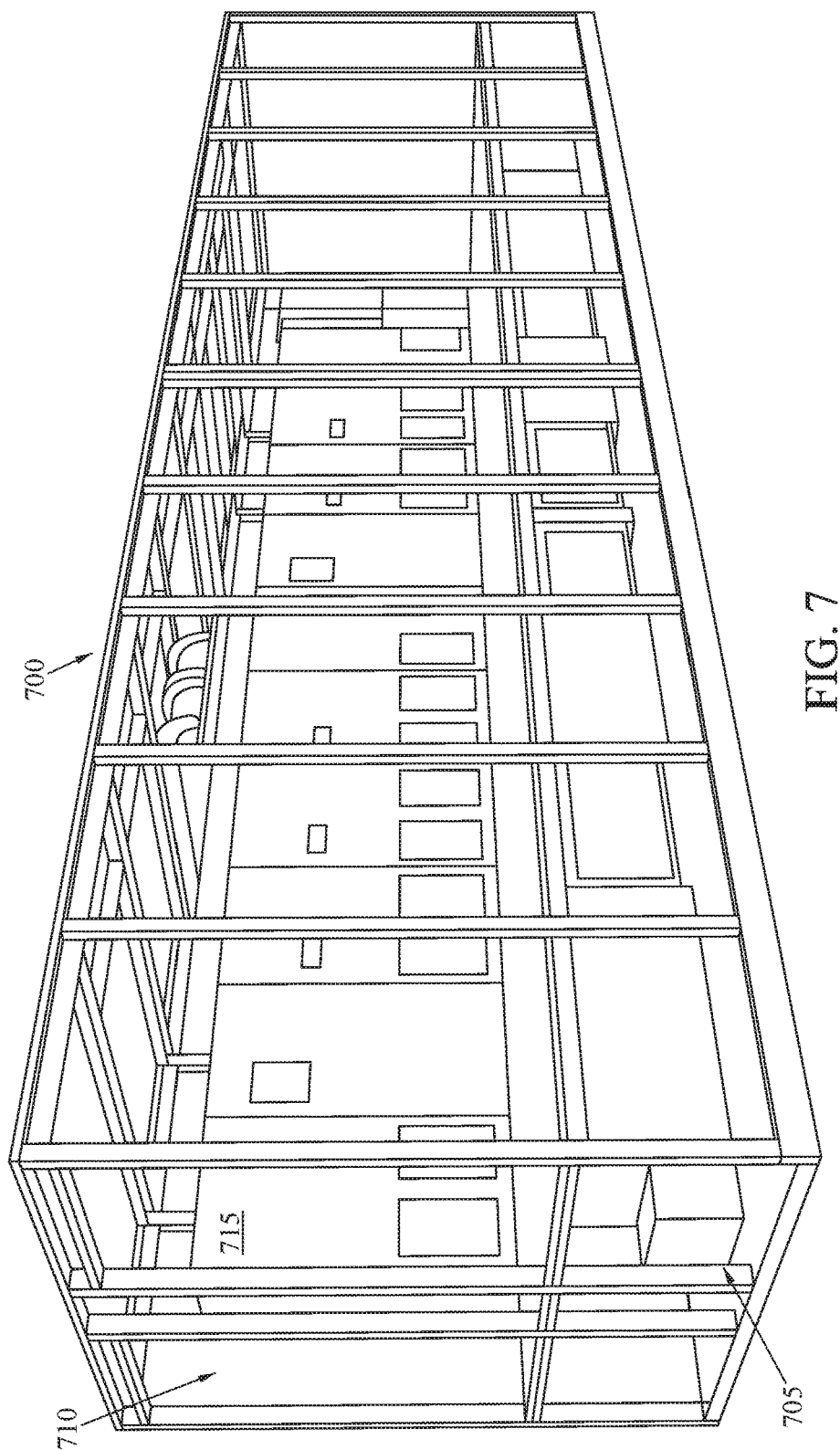
FIG. 7 depicts a perspective view of a power module.

FIG. 7 depicts a perspective view of power module 700. Power module 700 can be based on, for example, enclosure 205 of FIGS. 2A-2C. As illustrated, power module 700 includes sub-floor space 705 that can house various equipment as described above. For example, sub-floor space 705 can contain environmental management components for monitoring and/or maintaining the environmental conditions (e.g., temperature, humidity, air pressure, etc.) and/or other equipment for monitoring, controlling, and maintaining the operation of a data center.

Power module 700 includes an above-floor space 710. In the illustrated embodiment, above-floor space 710 contains power equipment 715. Power equipment 710 can include equipment for conditioning and distributing power to, for example, data modules 400 and 500 and network module 600. Power equipment 715 can include generators, transformers, power distribution panels/switches, and/or UPS systems.

Figure 8:
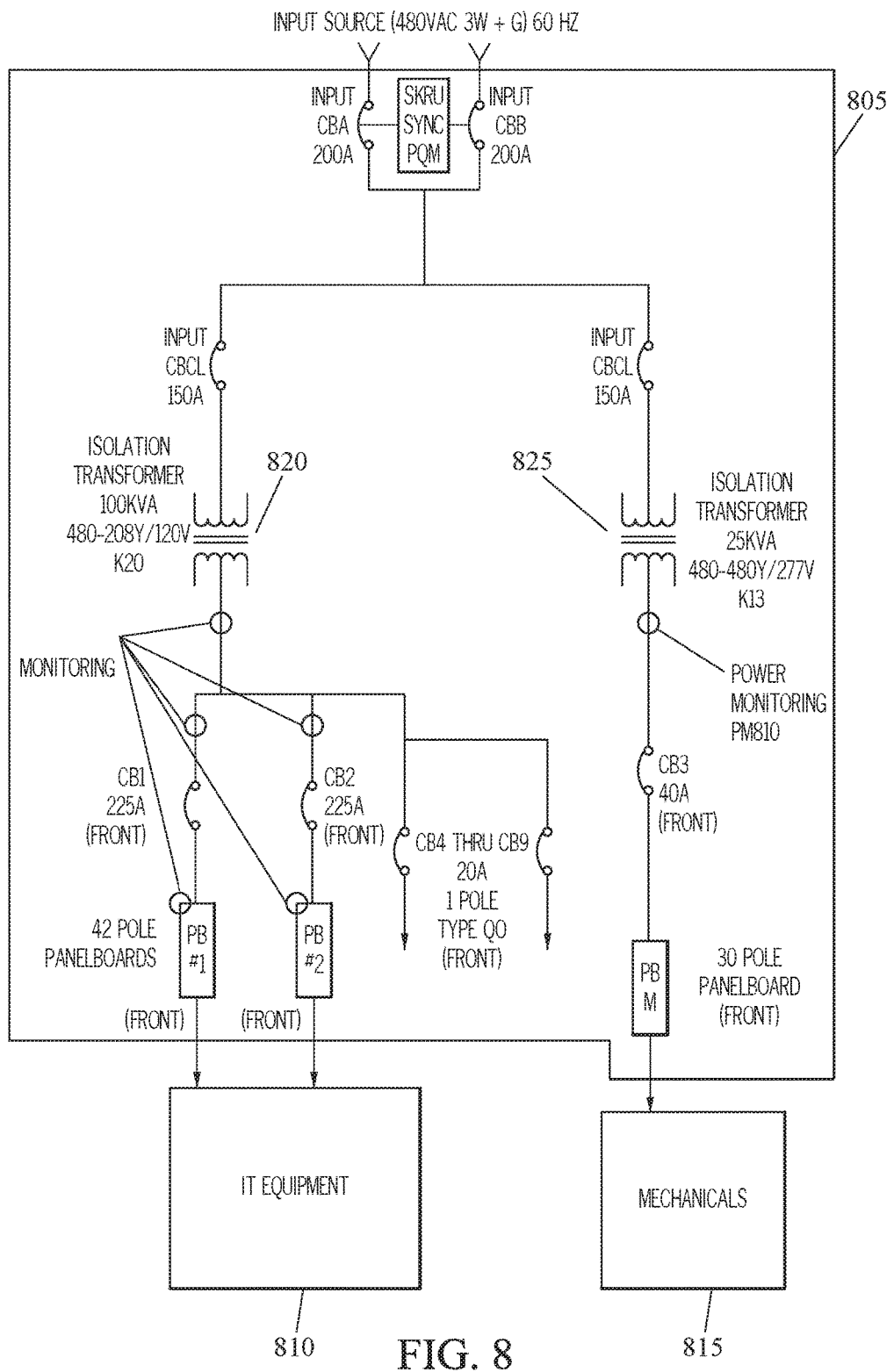
FIG. 8 depicts a wiring diagram.

FIG. 8 depicts a wiring diagram. FIG. 8 illustrates the connections between PDU 805 and IT equipment 810 and mechanicals 815. PDU 805 can be housed in a data module (e.g., data module 400 or 500) and connected to a power modules (e.g., power module 700). PDU 805 can be configured to distribute power to IT equipment 810 and mechanicals 815. IT equipment 810 can include IT equipment in one or more data modules (e.g., data modules 400 and 500) and/or networking equipment in one or more networking modules (e.g., network module 600). Mechanicals 815 can include environmental management components for monitoring and/or controlling the environmental conditions (e.g., temperature, humidity, air pressure, etc.) and/or other equipment for monitoring, controlling, and maintaining the operation of a data center in one or more data modules (e.g., data modules 400 and 500) and/or one or more networking modules (e.g., network module 600).

In the illustrated embodiment, PDU includes a transformer 820 for power distributed to IT equipment 810 and a transformer 825 for power distributed to mechanicals 815. By utilizing separate transformers for IT equipment 810 and mechanicals 815, PDU 805 can provide power properly conditioned for the equipment in the module. Utilizing transformer 820 and transformer 825 can facilitate isolating IT equipment electrical loads from mechanical or support infrastructure electrical loads.

Returning to FIG. 3, modular data center 300 can provide the power, communications, and environmental requirements for IT equipment in modular data center 300. As described above, power modules (e.g., power modules 315) can distribute power to the data modules (e.g., data modules 305) to meet the requirements of the contained IT equipment, along with any components in the sub-floor space. Network module 310 can provide data communication for the contained IT equipment.

With respect to environmental management, any of the modules (e.g., data modules 305, network module 310, or power modules 315) in modular data center 300 can include one or more sensors (e.g., temperature sensor, pressure sensor, humidity sensor, fan speed sensor, valve position sensor, etc.) disposed in the module in communication with a controller in the module. In some embodiments, the controller can monitor the signals from the sensors and adjust environmental parameters (e.g., temperature, air pressure, humidity, airflow speed, etc.) of the module.

In some embodiments, the controller can determine the differential pressure between the hot aisle and the cold aisle and modulate the speed of the fans in the AHUs to maintain a desired pressure differential between the hot and cold aisles.

In some embodiments, the controller can determine that the temperature within a modules exceeds a certain threshold and increase the speed of the fans in the AHUs to lower the temperature. In some embodiments, the controller can increase the flow of chilled fluid by opening the chilled fluid supply valve, thereby increasing the flow of chilled fluid to the AHUs to lower the temperature.

Modular data center 300 can include a data center control system 380. The data center control system 380 can be connected to one or more of the modules in the data center and collect information from the sensors discussed above. In some embodiments, the data center control system 380 can be connected to the IT equipment, environmental management equipment, and power generation and distribution equipment to collect data about the operation of the equipment.

Module Cooling

Figure 9:
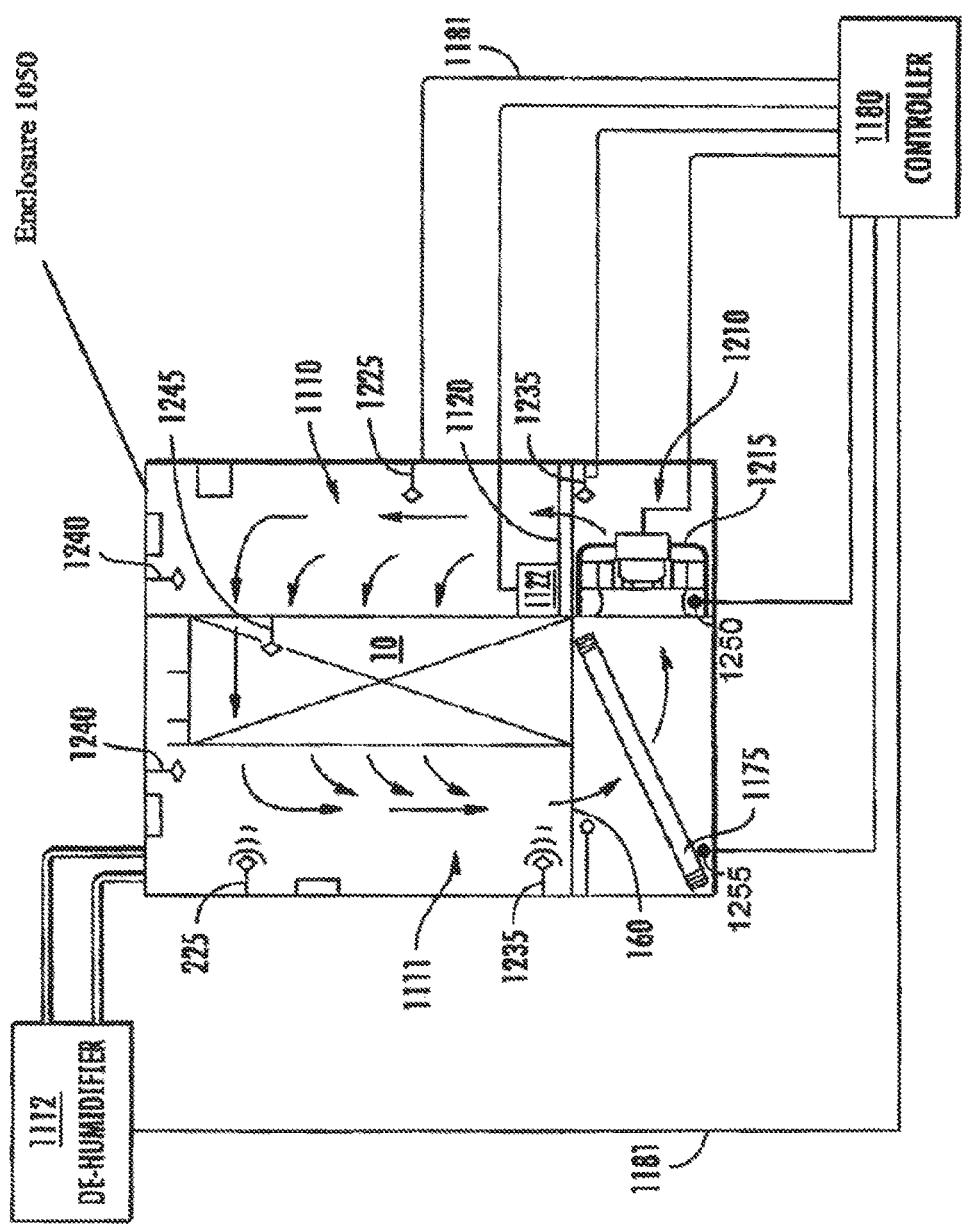
FIG. 9 depicts a cross-section view of an enclosure for use in a modular data center.

As discussed above, modules can provide environmental management by, for example, removing heat generated by IT equipment from the module. FIG. 9 depicts a cross-section view of an enclosure 1050 for use in a modular data center. The illustrated embodiment can be used, for example, as a data module. Enclosure 1050 contains cabinets 10 of IT equipments. Cabinets 10 can be in fluid communication with a pressurized plenum 1210. The particular number of plenums 1210 used can vary. In another example, multiple pressurized plenums 1210 can be utilized, such as one or more plenums being utilized for each row. The plenum 1210 can have one or more pressure sources, such as fan 1215, although other pressure sources are also contemplated including pumps and the like.

In one embodiment, the fan 1215 can be a centrifugal fan. The fan 1215 can include noise-absorption components and anti-vibration mounting components. Various filters and other components can be utilized in combination with the fan. In one embodiment, the fan 1215 can be an adjustable speed fan to increase or decrease the pressure in the plenum 1210. For example, the fan 1215 can be a variable frequency drive fan. In another embodiment, a plurality of fans 1215 can be in communication with the pressurized plenum 1210 so that the pressure can be increased by operating additional fans of the plurality of fans. The present disclosure also contemplates the fan configuration being modular. For instance, the fans 1215 can be easily added to the plenums, such as by removing a blocking plate that seals a wall of the plenum in the absence of the fan.

The cabinets 10 can be bound on a first side by a cold zone 1110 and bound on a second side by a hot zone 1111. In the exemplary embodiment shown, the cold and hot zones 1110, 1111 are access areas that have doors 1105 so that technicians can access the cabinets when needed (such as for adding or removing the electronic equipment). However, the present disclosure also contemplates the cold and hot zones 1110, 1111 being integrally formed with the cabinets 10 and/or defined by an insulated false wall between the access areas and the cabinets. In the exemplary embodiment of FIG. 15, each cabinet in a row share a cold zone 1110 and a hot zone 1111. However, the present disclosure contemplates other configurations of cold and hot zones 1110, 1111, such as individual cabinets or groups of cabinets in a single row having their own cold and hot zones. Adjacent hot and cold zones 1111, 1110 can be separated by a wall (not shown).

The pressurized plenum 1210 can generate a pressure differential between the cold zone 1110 and the hot zone 1111 thereby causing air to flow across the electronic equipment in the cabinets which removes heat from said equipment. The number and configuration of plenums that are utilized to generate the desired pressure differential can vary based on a number of factors, including the type of electronic equipment that is being environmentally managed. For example, a plurality of plenums 1210 can be in fluid communication with the cold and hot zones 1110, 1111 of each row. The pressurized plenums can generate positive pressure and/or negative pressure to create the desired pressure differential and thereby create air flow over the electronic equipment. For instance, a first pressurized plenum can generate a positive pressure (e.g., a desired pressure above ambient) in proximity to the cold zone 1110, while a second pressurized plenum generates a negative pressure (e.g., a vacuum) in proximity to the hot zone 1111.

In one embodiment, the use of pressurized plenums 1210 allows system 5 to isolate fans from the electronic equipment. For example, the pressurized plenums 1210 can increase air pressure using pumps so that the system does not utilize any fans. In another example, the pressure increase can result from the use of fans that are positioned remotely from the cabinets so that air flow from the fans does not directly contact the electronic equipment (e.g., the fans create air flow within the plenum that results in an increased pressure in the plenum which is in turn communicated to the cabinets).

The air passing over the electronic equipment is utilized to remove heat from the equipment. In turn, the cooling subsystem can then remove the heat from the air. In one embodiment, the cooling subsystem can be a vapor-compression cycle system, although other systems are also contemplated by the present disclosure. The subsystem can include a pump and one or more chillers for cooling water or other coolant (e.g., chilled liquid settings between 15 and 50 degrees Fahrenheit) which is then supplied to coils via supply lines and return lines. The coils 1175 can be positioned in thermal communication with the hot zone 1111. For example, the coil 1175 can be positioned under the floor 160 so that the air coming from hot zone 1111 passes through the coil 1175 then through the pressurized plenum 1210 and back into the cold zone 1111. The particular number and configuration of coils 1175 that are utilized can vary based on a number of factors, including the number of pressurized plenums and configuration of the cold and hot zones that are being utilized. For example, each row of cabinets 10 can have six equidistantly positioned pressurized plenums 1210 under the floor 160 with a coil 1175 in thermal communication with each of the plenums (e.g., positioned downstream of the hot zone 1111 and upstream of the cold zone 1110 for each plenum).

To control the environment surrounding the electronic equipment, a controller 1180 can be utilized. The controller can be a machine within which a set of instructions, when executed, may cause the machine to perform any one or more of the methodologies discussed herein. In some embodiments, the machine can operate as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The controller 1180 can be in communication with one or more sensors for receiving environmental information associated with the electronic equipment. For example, one or more temperature sensors 1225 and one or more pressure sensors 1235 can be positioned with respect to the electronic equipment so that the sensors can capture environmental information and transmit the information to the controller 1180. The particular positioning of the sensors can vary. For instance, temperature sensors 1225 can be placed both upstream and downstream of the coil 1175 so that the cooling efficiency of the coil can be easily monitored, while other temperature sensors can be placed in close proximity to the electronic equipment so that the amount of heat being generated by the electronic equipment can be more easily monitored. The pressure sensors 1235 can be placed both upstream and downstream of the pressurized plenum 1210 so that the pressure differential can be more easily monitored. The type of sensor used to capture the environmental information can also vary, including pressure and temperature transducers and thermocouples.

In one embodiment, other sensors can also be used to further monitor the environmental conditions associated with the electronic equipment, such as humidity sensors 1240 and flow sensors 1245. The humidity sensors 1240 allow the controller 1180 to monitor the humidity that the electronic equipment is being exposed to and to adjust the humidity accordingly, such as through use of a de-humidifier 1112 that is in fluid communication with the electronic equipment. The flow sensors 1245 allow the controller 1180 to monitor the flow rate of air, such as for determining heat transfer via convection. The use of flow sensors 1245 can also be used for determining other environmental characteristics, such as air flow turbulence, that can have an adverse impact on the cooling of the electronic equipment or the equipment itself. In some embodiments, the controller 1180 may use data from fan speed sensor 1250 associated with fan 1215 and/or valve position sensor 1255 associated with coolant flowing through coil 1175.

The sensors can communicate with the controller 1180 via hardwire (e.g., cables 1181) and/or wireless links 1182. The particular communication protocols that are utilized can vary and can include Wireless Fidelity or WiFi services, Bluetooth, GSM, CDMA, UMTS, WiMAX, MODBUS and so forth. A combination of communication techniques can also be utilized, such as allowing the sensors to communicate both wirelessly and via hardwire to provide redundancy so that data is not lost in the event of a link failure.

The controller 1180 can receive the environmental information from the sensors and adjust the environmental conditions accordingly. In one embodiment, each of the cabinets 10 can have a range of environmental conditions that are acceptable. In real time, the controller 1180 can receive the environmental information associated with each of the cabinets 10 and then in real time can adjust one or more of the temperature, pressure and humidity associated with the cabinets.

For example, the controller 1180 can determine that a first cabinet 10 needs to lower its temperature by a desired amount. The controller 1180 can then transmit control signals for making the appropriate adjustment to achieve the desired temperature change. For instance, the controller 1180 can transmit a control signal to the cooling subsystem to increase coolant flow to the coil 1175 that is associated with the particular cabinet or to decrease the temperature of the coolant that is being provided to the coil. In one embodiment, the controller 1180 can transmit a control signal to the cooling subsystem which designated a desired temperature and the subsystem can then implement the necessary steps to achieve the desired temperature. As another example, the controller 1180 can transmit a control signal to the pressurized plenum that is associated with the particular cabinet so that the pressure differential is increased thereby increasing the air flow through the particular cabinet. In one embodiment, the controller 1180 can independently utilize the pressurized plenum 1210 and the cooling subsystem to adjust the temperature associated with a particular cabinet. In another embodiment, the controller 1180 can utilize both of the pressurized plenum 1210 and the cooling subsystem to adjust the temperature associated with a particular cabinet.

As another example, the controller 1180 can determine that a first cabinet 10 needs to decrease its air flow rate through the cabinet 10 a desired amount. The controller 1180 can then transmit control signals for making the appropriate adjustment to achieve the desired air flow rate. For instance, the controller 1180 can transmit a control signal to the pressure source 1215 of the pressurized plenum to decrease the pressure within the plenum that is associated with the particular cabinet. In one embodiment, a damper 1120 can be utilized for air flow control. For instance, the damper 1120 can be positioned downstream of the pressurized plenum 1210 and opened or closed using an actuator 1122 (e.g., a servo-motor or other movable control device). In this example, the controller 1180 can restrict air flow to the particular cabinet by sending, control signals to the actuator 1122 which results in the damper moving towards a closed position.

Controller 1180 can also utilize historical information to provide environmental management for the cabinets 10. For example, the controller 1180 can monitor the temperature of particular cabinets based on particular times of the day and adjust the environmental conditions of the cabinets in anticipation of those temperatures. For instance, historical data may show that electronic equipment in a particular cabinet is typically being used to capacity during the morning with a resulting elevation of cabinet temperature during those morning hours. The controller 1180 can adjust the temperature in the particular cabinet to a lower portion of the desired range in anticipation of the increased temperature in the morning. The historical data can be maintained in a memory of the controller 1180 or can be stored elsewhere and retrieved by the controller.

Controller 1180 can also maintain historical information associated with the efficiency of the thermal control being implemented by the controller. For example, the controller 1180 can implement several different techniques for achieving a desired environmental condition and compare the techniques to determine which was the most efficient. For instance, where a temperature decrease is needed, the controller 1180 can on a first occasion utilize an increase in pressure differential to achieve the lower temperature. On a second occasion, the controller 1180 can utilize the cooling subsystem to achieve the lower temperature. The controller 1180 can then determine efficiency based on such factors as the amount of time needed to achieve the lower temperature, the amount of power utilized in achieving the lower temperature and so forth. In this example, the controller 1180 can then utilize this historical information to determine which thermal management techniques should be utilized in the future based on the particular circumstances.

In one embodiment, other factors can also be analyzed by the controller 1180 for determining the particular technique to utilize to achieve the desired environmental condition. For instance, vibration or noise can be monitored with respect to the use of certain components of the system 5 and the amount of vibration or noise can be a factor in determining which technique (e.g., which cooling components) should be utilized.

Figure 10:
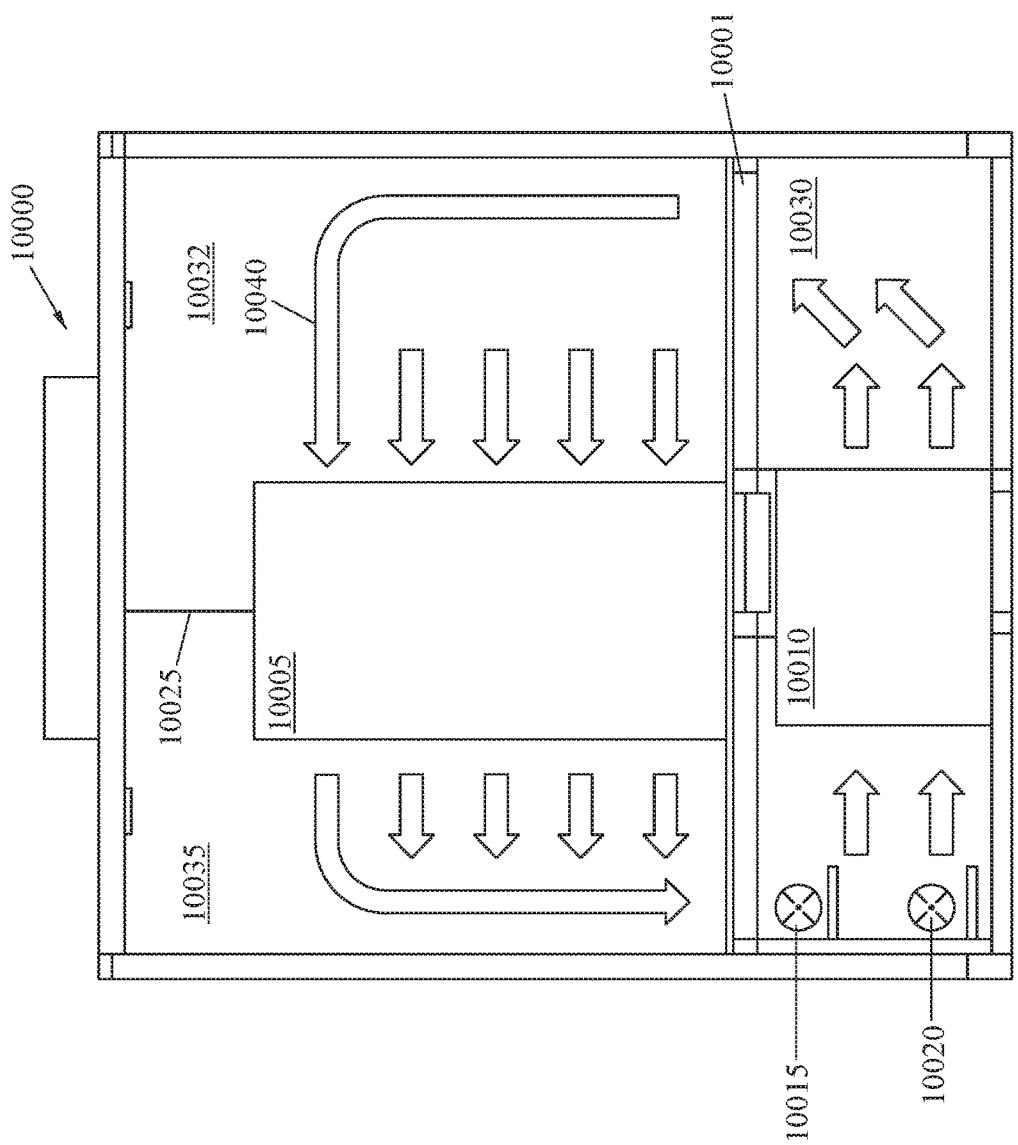
FIG. 10 depicts a cross-section view of an enclosure for use in a modular data center.

FIG. 10 depicts a cross-section view of an enclosure 10000 for use in a modular data center. Enclosure 10000 contains floor 10001 that divides the interior of enclosure 10000 into above-floor space 10001 and sub-floor space 10002. Enclosure 10000 can be used, for example, as a data module, a network module, or a power module. In the illustrated embodiment, enclosure 10000 is configured as a data module and contains IT equipment 10005. Enclosure 10000 contains AHU 10010, which is supplied chilled fluid by chilled fluid supply pipe 10015 and fluid return pipe 10020. Enclosure 10000 contains flexible barrier 10025.

IT equipment 10005 can be in fluid communication with pressurized plenum 10030. Pressurized plenum 10030 can have one or more pressure sources, such as AHU 10010. AHU 10010 can include a variable-speed, variable-frequency-drive fan. AHU 10010 can be in communication with pressurized plenum 10030 and configured to increase the pressure within pressurized plenum 10030 (e.g., by activating its fan). IT equipment 10005 can separate above-floor space 10001 into cold aisle 10032 and hot aisle 10035. In the illustrated embodiment, cold aisle 10032 and hot aisle 10035 can provide technicians access to the IT equipment 10005. Flexible barrier 10025 can facilitate separation of cold aisle 10032 and hot aisle 10035 (alone and/or in conjunction with IT equipment 10005.

AHU 10010 can increase the pressure within pressurized plenum 10030 to generate a pressure differential between cold aisle 10032 and hot aisle 10035, thereby causing air 10040 to flow across and/or through IT equipment 10005 the electronic equipment. The flow of air 10040 across and/or through IT equipment 10005 can remove heat from IT equipment 10005. In turn, AHU 10010, by use of, for example, a heat exchanger, can then remove the heat from the air 10040. In some embodiments, the AHU utilizes a vapor-compression cycle heat exchanger. AHU 10010 can transfer the heat to chilled fluid from chilled fluid supply pipe 10015, which can then be expelled via fluid return pipe 10020.

Modular Data Center Provisioning

The modular data center technology described above permits scalable provisioning and deployment of data centers based on computing needs. In some embodiments, a data center can be provisioned based on a computing capacity parameter and a redundancy parameter. The number of data modules, network modules, and power modules required for the modular data center can be determined based on the computing capacity parameter and the redundancy parameter.

As an illustrative example, a data center can be provisioned based on a specific amount of kilowatts or KW ("Required KW") and redundancy ("Required Redundancy"). The Required KW can be the amount of peak power required by the IT equipment that will be housed in the modular data center. The Required Redundancy can be the level of redundancy in power supply, backup, cooling, and data bandwidth required by the IT equipment.

One or more data modules can be provided based on the Required KW. For example, the number of the data modules can be determined based on the amount of cooling capacity required to maintain IT equipment consuming the Required KW.

One or more network modules can be provided to facilitate network communications by the IT equipment housed in the data modules. For example, the number of network modules can be determined based on the Required KW (e.g., as an indication of the anticipated IT equipment activity) and the Required Redundancy.

One or more power modules can be provided to distribute power to the data modules and network modules. For example, the number of power modules can be determined based on the Required KW, in addition to the power required by the network module or modules and the environmental management equipment in the data modules.

Figure 11:
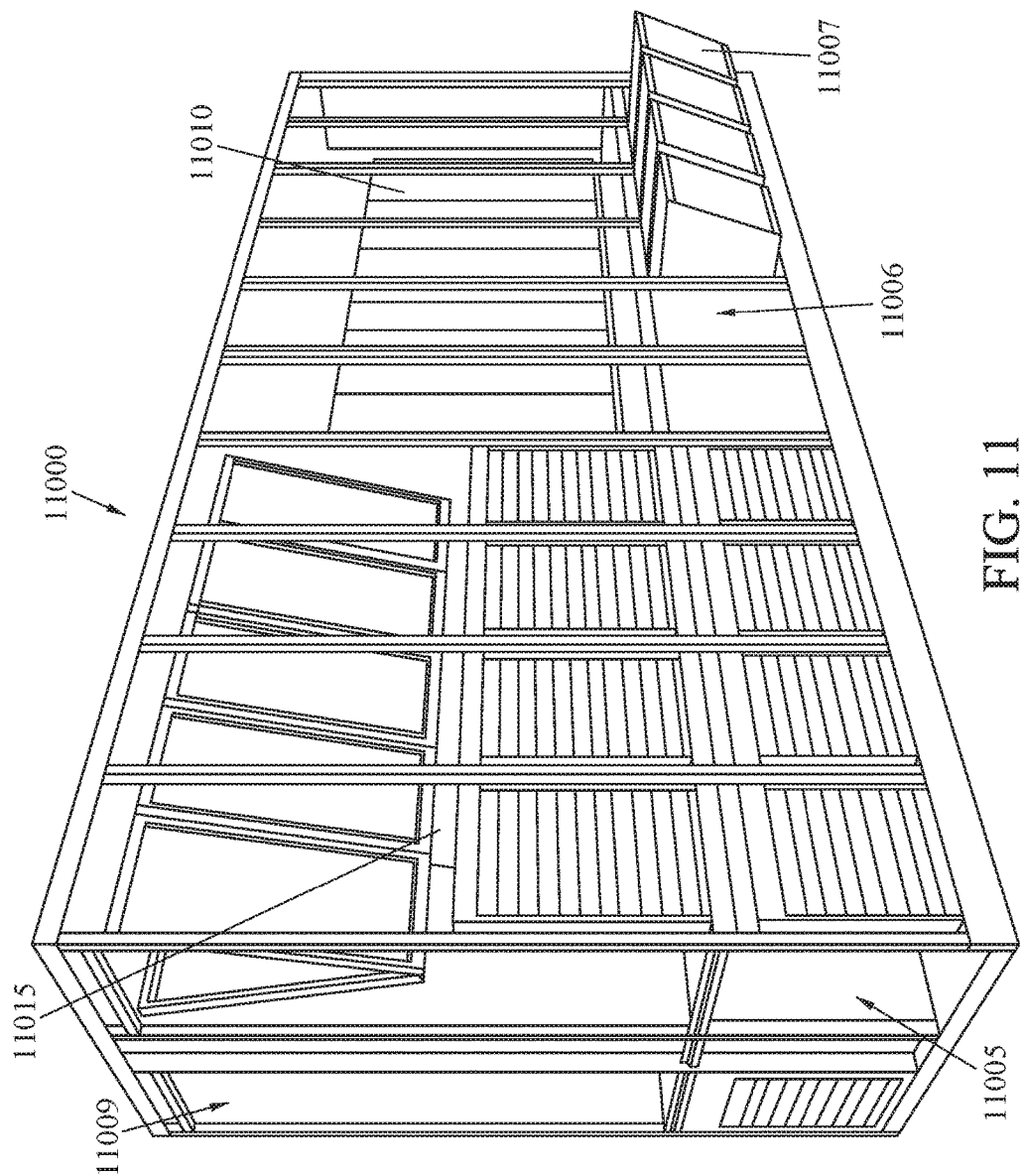
FIG. 11 depicts a perspective view of a modular data center.

FIG. 11 depicts a perspective view of a modular data center 11000. Modular data center 11000 can be based on, for example, enclosure 205 of FIGS. 2A-2C. As illustrated, modular data center 11000 includes sub-floor space 11005 that can house various equipment as described above. For example, sub-floor space 11005 can contain environmental management components for monitoring and/or controlling the environmental conditions (e.g., temperature, humidity, air pressure, etc.) and/or other equipment for monitoring, controlling, and maintaining the operation of a data center. In the illustrated example, sub-floor space 11005 contains AHU s 11006 and free-air handler units 11007. Free-air handler units 11007 utilize air external to modular data center 11000 to remove heat energy from the interior of modular data center 11000.

Modular data center 11000 includes an above-floor space 11009. In the illustrated embodiment, above-floor space 11009 contains IT equipment 11010. IT equipment 11010 can include servers, storage systems, and/or networking equipment. In the illustrated embodiment, above-floor space 11007 contains power generation and distribution equipment 11015. Power generation and distribution equipment 11015 can include power generators, PDU s, UPS systems to provide and maintain power supplied to IT equipment 11010 and the equipment in sub-floor space 11005. By including power generation and distribution equipment 11015, modular data center 11000 can operate without connections to external utilities, such as electricity and chilled water.

Figure 12A:
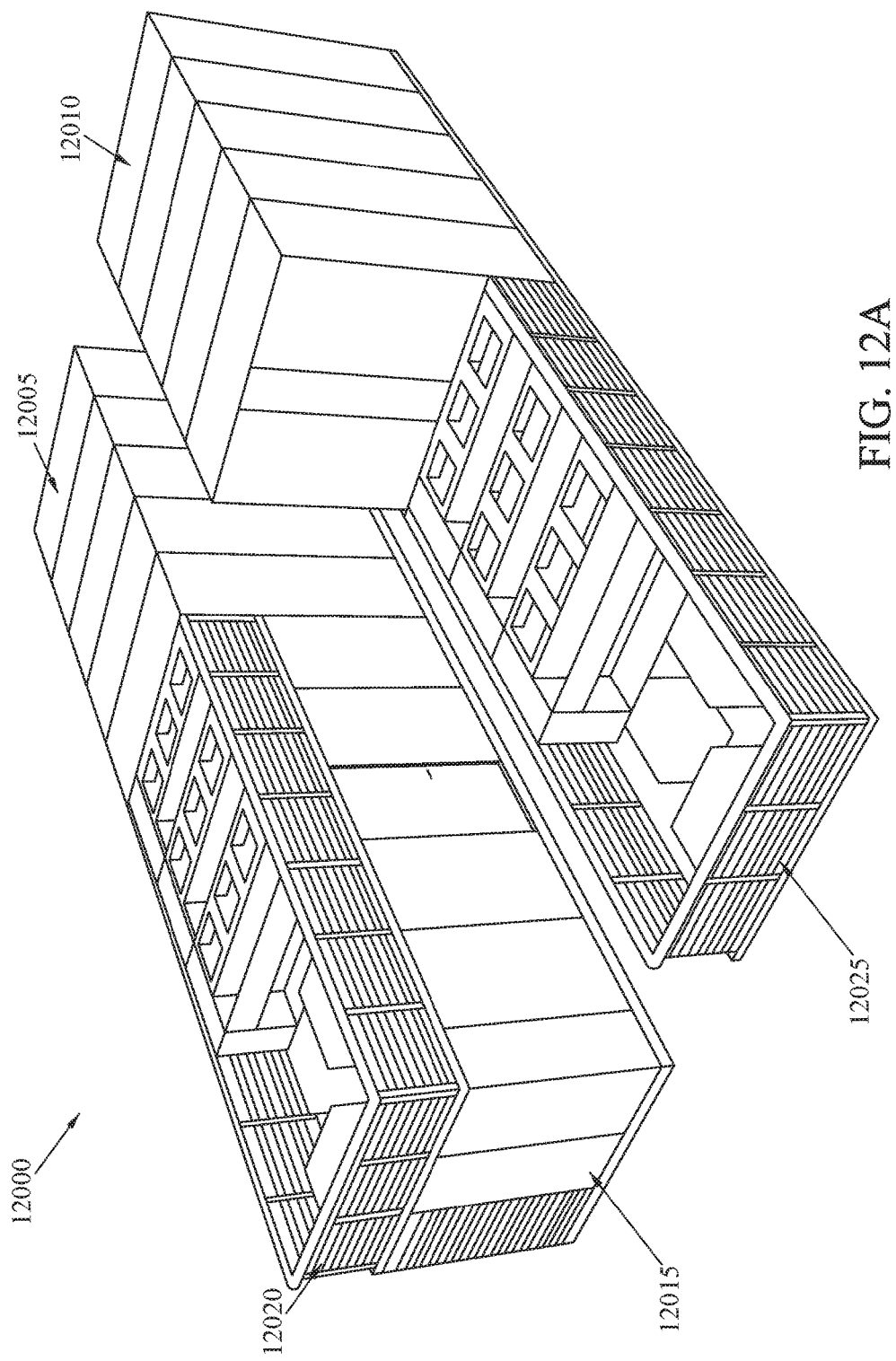
FIG. 12A depicts a perspective view of a modular data center.

FIG. 12A depicts a perspective view of a modular data center 12000. Modular data center 12000 includes data module 12005, data module 12010, power module 12015, cooling module 12020, and cooling module 12025. In the illustrated embodiment, data module 12005 and data module 12010 can house, for example, IT equipment. Cooling module 12020 and cooling module 12025 can provide chilled fluid to data module 12005 and data module 12010, respectively, via one or more pipes (not shown) to facilitate maintaining the environmental conditions in data module 12005 and data module 12010. Power module 12015 can provide power to data module 12005, data module 12010, cooling module 12020, and cooling module 12025 via one or more electrical connections. While the illustrated data center (data center 12000) is shown with two data modules (data module 12005 and data module 12010), two cooling modules (cooling module 12020 and cooling module 12025) and one power module (power module 12015), it should be appreciated that the described technology supports other configurations and can scale to meet IT power and cooling needs. It should be appreciated that such other configurations and scaling may include any ratio amongst similar or differing module types. For example, in some embodiments, a power module can provide power to 3 or more data modules and 2 or more cooling modules. In some embodiments, a cooling module can provide chilled fluid to more than one data modules. In some embodiments, the data center can include more than one power modules, along with multiple data modules and cooling modules.

Figure 12B:
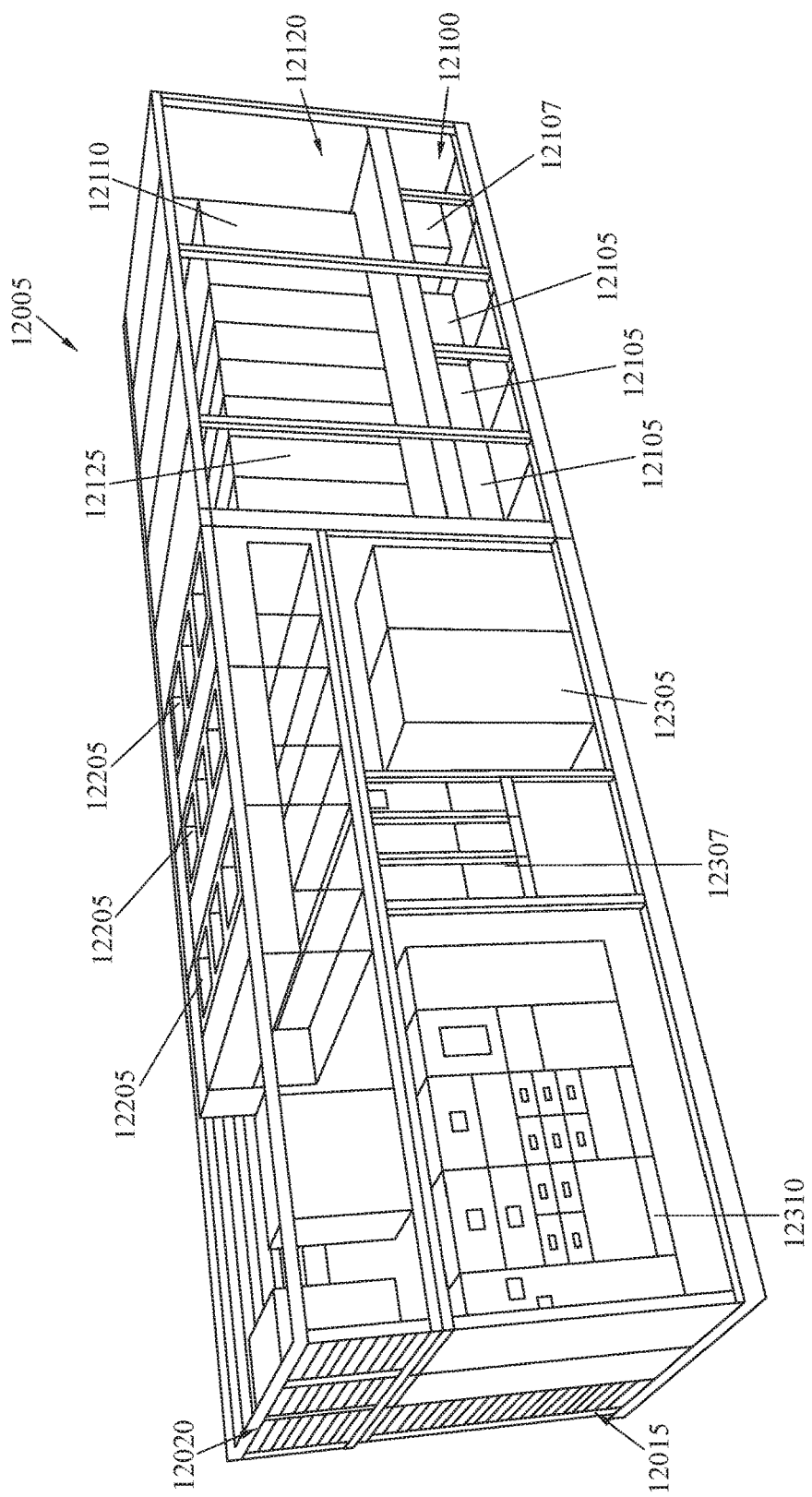
FIG. 12B depicts a cross-section view of a data module, power module, and cooling module.

FIG. 12B depicts a cross-section of data module 12005, power module 12015, and cooling module 12020. As illustrated, data module 12005 includes sub-floor space 12100 that can be used to house various equipment as described above. For example, sub-floor space 12100 can contain environmental management components for monitoring and/or controlling the environmental conditions (e.g., temperature, humidity, air pressure, etc.) and/or other equipment for monitoring, controlling, and maintaining the operation of a data center. In the illustrated embodiment, sub-floor space 12100 includes AHUs 12105, MAU 12107, and PDUs 12110. In some embodiments, sub-floor space 12100 may be accessible from inside data module 12005. In some embodiments, subfloor space 12100 may be inaccessible from inside data module 12005 to accommodate, for example, partitioning of personnel that have access to the data module area and the sub-floor space area. As described above, AHUs 12105 can remove heat energy from the above-floor space 12120. MAU 12107 can regulate the environment in above-floor space 12120 by drawing air from outside data module 12005 into its interior and expelling air from inside data module 12005 (e.g., for maintaining humidity and/or supplying fresh air). PDUs 12110 can distribute electrical power from power module 12015 to IT equipment 12120 and any environmental management equipment (e.g., AHUs 12105 and MAU 12107).

Data module 12005 includes above-floor space 12120. Above-floor space 12120 can include IT equipment 12125. In the illustrated embodiment, IT equipment 12125 can divide above-floor space 12120 into a hot aisle and cold aisle. IT equipment 12125 can include servers, storage systems, and/or networking equipment. In some embodiments, the hot aisle and cold aisle are at least partially separated by a barrier, such as the barriers described in U.S. patent application Ser. No. 12/837,167, titled Apparatus and Method for Regulating Various Conditions Affecting Electronic Equipment, and filed Jul. 15, 2010. Such barriers, for example, can be used to provide greater separation of the hot aisle and cold aisle. In some embodiments, an air pressure differential between the hot aisle and cold aisle is maintained by environmental management components in sub-floor space 12100. As described in greater detail above, the air pressure differential can facilitate cooling IT equipment and reduce hot/cold aisle recirculation.

While data module 12005 is illustrated with IT equipment 12125 dividing the above-floor space into a hot aisle and cold aisle, it should be appreciated that data module 12005 can accommodate any arrangement of IT equipment in above-floor space 12120.

Cooling module 12020 includes cooling units 12205. In some embodiments, cooling units 12205 are heat exchangers that remove heat energy from fluid and provide chilled fluid to data module 12005. Cooling units 12205 can utilize water, refrigerant, gas, or other kinds of fluid. In some embodiments, one or more of cooling units 12205 can provide chilled fluid to AHUs 12105 to facilitate removing heat from the interior of data module 12005. In some embodiments, one or more of cooling units 12205 can provide chilled fluid to MAU 12107 to facilitate removing heat from outside air before the air is introduced into the interior of data module 12005.

Power module 12015 includes generator 12305 and UPS 12310. Generator 12305 can include an integrated fuel tank for storing fuel to power the generator. In some embodiments, power module 12015 can be connected to the electrical utility grid. Power module 12015 can provide power to data module 12005 and cooling module 12020 from the utility grid. UPS 12310 can be configured to provide power to data module 12005 and cooling module 12020 based upon intelligent business rules. For example: a failure of the utility grid may be detected and a business rule may direct a control function of the UPS 12310 to provide power until generator 12305 begins generating power; a business rule may determine that it is preferable (e.g. cheaper) to obtain power from UPS 12310 for a determined time period; etc.

The methodology and techniques described with respect to the exemplary embodiments can be performed using a machine or other computing device within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The machine may include a processor (e.g., a central processing unit (CPU), a graphics processing unit (GPU, or both), a main memory and a static memory, which communicate with each other via a bus. The machine may further include a video display unit (e.g., a liquid crystal display (LCD), a flat panel, a solid state display, or a cathode ray tube (CRT)). The machine may include an input device (e.g., a keyboard), a cursor control device (e.g., a mouse), a disk drive unit, a signal generation device (e.g., a speaker or remote control) and a network interface device.

The disk drive unit may include a machine-readable medium on which is stored one or more sets of instructions (e.g., software) embodying any one or more of the methodologies or functions described herein, including those methods illustrated above. The instructions may also reside, completely or at least partially, within the main memory, the static memory, and/or within the processor during execution thereof by the machine. The main memory and the processor also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions, or that which receives and executes instructions from a propagated signal so that a device connected to a network environment can send or receive voice, video or data, and to communicate over the network using the instructions. The instructions may further be transmitted or received over a network via the network interface device.

While the machine-readable medium is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of arrangements described herein are intended to provide a general understanding, of the structure of various embodiments, and they are not intended to serve as a complete description of all the elements and features of apparatus and systems that might make use of the structures described herein. Many other arrangements will be apparent to those of skill in the art upon reviewing the above description. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention. Combinations of the above arrangements, and other arrangements not specifically described herein, will be apparent to those of skill in the art upon reviewing the above description. Therefore, it is intended that the disclosure not be limited to the particular arrangement(s) disclosed as the best mode contemplated for carrying out this invention, but that the invention will include all embodiments and arrangements falling within the scope of the appended claims.

The above-described techniques can be implemented in digital electronic circuitry, or in computer hardware, firmware, software, or in combinations of them. The implementation can be as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

To provide for interaction with a user, the above described techniques can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other.

The technology has been described in terms of particular embodiments. The alternatives described herein are examples for illustration only and not to limit the alternatives in any way. The steps of the invention can be performed in a different order and still achieve desirable results. Other embodiments are within the scope of the following claims.

What is claimed is:

1. A modular data center comprising:
   a controller;
   a data center control system configured to collect data center data associated with the modular data center via communication with one of the controller and a plurality of sensors; and
   a data module connected to a power supply source, the power supply source comprising at least one of a power grid, a backup power source and a power module, wherein the power module comprises electronics equipment for conditioning and distributing power to the one or more data modules,
   wherein the data module comprises:
   a first enclosure defining a first internal space; and a first sensor in the plurality of sensors, the first sensor in communication with at least one of the controller and the data center control system, and wherein the first enclosure is configured to contain a heat exchanger configured to remove heat from air within the first enclosure of the data module, and wherein a second sensor in the plurality of sensors in communication with the power supply source.

2. The modular data center of claim 1, further comprising a structure disposed in t the data module, the structure separating the above-floor space into a first aisle and a second aisle.

3. The modular data center of claim 1, wherein the structure comprises computing equipment.

4. The modular data center of claim 1, wherein the controller adjusts an environmental parameter of the data module based upon the data center data.

5. The modular data center of claim 4, wherein the environmental parameter is one of a temperature within the first enclosure, a pressure within the first enclosure, a humidity within the first enclosure, or an airflow speed within the first enclosure.

6. The modular data center of claim 5, wherein the plurality of sensors are one of a power meter, temperature sensor, pressure sensor, humidity sensor, fan speed sensor, or valve position sensor.

7. The modular data center of claim 6, further comprising a network operations center in the data module.

8. The modular data center of claim 7, wherein the data module is one of a plurality of data modules.

9. The modular data center of claim 8, wherein the each data module in the plurality of data modules comprise at least one sensor of the plurality of sensors.

10. The modular data center of claim 9, wherein the controller determines, based upon data received from the first sensor, an environmental condition of the data module.

* * * * *